US012341465B2

(12) United States Patent
Wheeler

(10) Patent No.: US 12,341,465 B2
(45) Date of Patent: Jun. 24, 2025

(54) PHOTOVOLTAIC DEVICES FOR SWITCHABLE WINDOWS

(71) Applicant: Alliance for Sustainable Energy, LLC, Golden, CO (US)

(72) Inventor: Lance Michael Wheeler, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 209 days.

(21) Appl. No.: 17/619,375

(22) PCT Filed: Jul. 10, 2020

(86) PCT No.: PCT/US2020/041635
§ 371 (c)(1),
(2) Date: Dec. 15, 2021

(87) PCT Pub. No.: WO2021/007530
PCT Pub. Date: Jan. 14, 2021

(65) Prior Publication Data
US 2022/0302400 A1 Sep. 22, 2022

Related U.S. Application Data

(60) Provisional application No. 62/872,314, filed on Jul. 10, 2019.

(51) Int. Cl.
*H02S 20/26* (2014.01)
*G02F 1/03* (2006.01)
(Continued)

(52) U.S. Cl.
CPC ............ *H02S 20/26* (2014.12); *G02F 1/0327* (2013.01); *H01G 9/20* (2013.01); *H01G 9/2009* (2013.01);
(Continued)

(58) Field of Classification Search
CPC ......... H02S 20/22; H02S 20/26; H10K 30/10; H10K 30/20; H10K 30/30; H10K 85/113;
(Continued)

(56) References Cited

U.S. PATENT DOCUMENTS

2011/0168248 A1* 7/2011 Koenemann ........... B82Y 10/00
257/E51.012
2012/0167972 A1 7/2012 Tseng et al.
(Continued)

OTHER PUBLICATIONS

Traverse, C.J. et al., "Emergence of highly transparent photovoltaics for distributed applications," Nature Energy, vol. 2, Nov. 2017, 12 pages.
(Continued)

*Primary Examiner* — Lindsey A Buck
(74) *Attorney, Agent, or Firm* — Michael A. McIntyre

(57) ABSTRACT

The present disclosure relates to a device that includes a switchable photovoltaic (PV) device that includes a first active material and a static PV device that includes a second active material, where the switchable PV device and the static PV device are positioned substantially parallel to one another, the switchable PV device has a first state that is substantially transparent to a first wavelength of light in the visible spectrum, the switchable PV device has a second state this is substantially opaque to a second wavelength of light in the visible spectrum, the switchable PV device can be reversibly switched between the first state and the second state, the static PV device is substantially transparent to the visible spectrum of light, and both the switchable PV device and static PV device are capable of generating power.

19 Claims, 16 Drawing Sheets

(51) Int. Cl.
  *H01G 9/20* (2006.01)
  *H02S 20/22* (2014.01)
  *H10F 19/40* (2025.01)
  *H10K 30/10* (2023.01)
  *H10K 30/20* (2023.01)
  *H10K 30/30* (2023.01)
  *H10K 30/88* (2023.01)
  *H10K 85/10* (2023.01)
  *H10K 85/50* (2023.01)
  *H10K 85/60* (2023.01)

(52) U.S. Cl.
  CPC ............. *H02S 20/22* (2014.12); *H10F 19/40* (2025.01); *H10K 30/10* (2023.02); *H10K 30/20* (2023.02); *H10K 30/30* (2023.02); *H10K 30/88* (2023.02); *H10K 85/113* (2023.02); *H10K 85/50* (2023.02); *H10K 85/6576* (2023.02); *G02F 2201/08* (2013.01)

(58) Field of Classification Search
  CPC .... H10K 85/6576; H01G 9/20; H01G 9/2009; H10F 19/40
  See application file for complete search history.

(56) References Cited

U.S. PATENT DOCUMENTS

| | | | |
|---|---|---|---|
| 2014/0090687 A1* | 4/2014 | Den Boer | H02S 20/26 136/246 |
| 2014/0166080 A1* | 6/2014 | Aleksov | H10K 39/10 136/251 |
| 2017/0089128 A1* | 3/2017 | Wheeler | E06B 9/24 |
| 2018/0301578 A1 | 10/2018 | Rozbicki | |
| 2018/0330891 A1 | 11/2018 | Wheeler et al. | |

OTHER PUBLICATIONS

Wheeler, L.M. et al., "Switchable photovoltaic windows enabled by reversible photothermal complex dissociation from methylammonium lead iodide," Nature Communications, Nov. 2017; DOI: 10.1038/s41467-017-01842-4; 9 pages.

International Search Report and Written Opinion of corresponding PCT patent application No. PCT/US20/41635, issued Nov. 17, 2020, 7 pages total.

* cited by examiner

PHOTOVOLTAIC DEVICES FOR SWITCHABLE WINDOWS

CROSS-REFERENCE TO RELATED APPLICATIONS

This application claims priority from U.S. Provisional Patent Application No. 62/872,314 filed Jul. 10, 2019, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a device that includes a switchable photovoltaic (PV) device that includes a first active material and a static PV device that includes a second active material, where the switchable PV device and the static PV device are positioned substantially parallel to one another, the switchable PV device has a first state that is substantially transparent to a first wavelength of light in the visible spectrum, the switchable PV device has a second state this is substantially opaque to a second wavelength of light in the visible spectrum, the switchable PV device can be reversibly switched between the first state and the second state, the static PV device is substantially transparent to the visible spectrum of light, and both the switchable PV device and static PV device are capable of generating power.

In some embodiments of the present disclosure, the static PV device may absorb a wavelength of light in at least one of the infrared (IR) region of light and/or in the ultraviolet (UV) region of light. In some embodiments of the present disclosure, the first active material may include a perovskite. In some embodiments of the present disclosure, the perovskite may include a metal halide perovskite. In some embodiments of the present disclosure, the perovskite may include an alkylammonium lead halide. In some embodiments of the present disclosure, the perovskite may include methylammonium lead iodide.

In some embodiments of the present disclosure, the second active material may include at least one of an inorganic semiconductor and/or an organic semiconductor. In some embodiments of the present disclosure, the organic semiconductor may include at least one of poly[2,6'-4,8-di(5-ethylhexylthienyl)benzo[1,2-b;3,3-b[dithiophene]-alt-[3-fluoro-2[(2-ethylhexyl)carbonyl]thieno[3,4-b[thiophenediyl], [6,6]-phenyl-C71-butyric acid methyl ester, and/or 2,2'-((2Z,2'Z)-(((4,4,9,9-tetrakis(4-hexylphenyl)-4,9-dihydro-sindaceno[1,2-b:5,6-b']dithiophene-2,7-diyl)bis(4-((2-ethylhexyl)oxy)thiophene-5,2-diyl))bis(methanylylidene))bis(5,6-difluoro-3-oxo-2,3-dihydro-1H-indene-2,1-diylidene))dimalononitrile.

In some embodiments of the present disclosure, the first wavelength of light may be between 380 nm and 750 nm, inclusively. In some embodiments of the present disclosure, the second wavelength of light may be between 380 nm and 750 nm, inclusively. In some embodiments of the present disclosure, the switchable PV device may further include, in order, a first charge collecting layer, a first charge transport layer, the first active material, a second charge transport layer, and a second charge collecting layer.

In some embodiments of the present disclosure, the static PV device may further include, in order, a third charge collecting layer, a third charge transport layer, the second active material, a fourth charge transport layer, and a fourth charge collecting layer. In some embodiments of the present disclosure, the switchable PV device and the static PV device may each have a planar form, and the switchable PV device and the static PV device may be positioned substantially parallel to one another.

In some embodiments of the present disclosure, the device may further include a first layer and a second layer, where each of the first layer and the second layer may be positioned substantially parallel to the switchable PV device, the switchable PV device and the static PV device may be both positioned between the first layer structure and the second layer, both the first layer and the second layer may be substantially transparent to light in the visible spectrum, and at least one of the first layer or the second layer may be substantially transparent to at least one of IR light or UV light.

In some embodiments of the present disclosure, the device may further include a support structure, where the support structure may be in physical contact with at least one of the switchable PV device, the static PV device, the first layer, and/or the second layer, and the support structure may be substantially transparent to visible light.

BACKGROUND

Photovoltaic (PV) windows are currently limited in the amount of light that may be converted to electrical power by the demand for visible light to pass through the window during parts of the day. Thus, there remains a need for improved materials, methods, and devices that can increase the maximum light that may converted by PV windows without sacrificing the visible light transmission when it is needed.

BRIEF DESCRIPTION OF THE DRAWINGS

Exemplary embodiments are illustrated in referenced figures of the drawings. It is intended that the embodiments and figures disclosed herein are to be considered illustrative rather than limiting.

REFERENCE NUMBERS

Figure 1A:
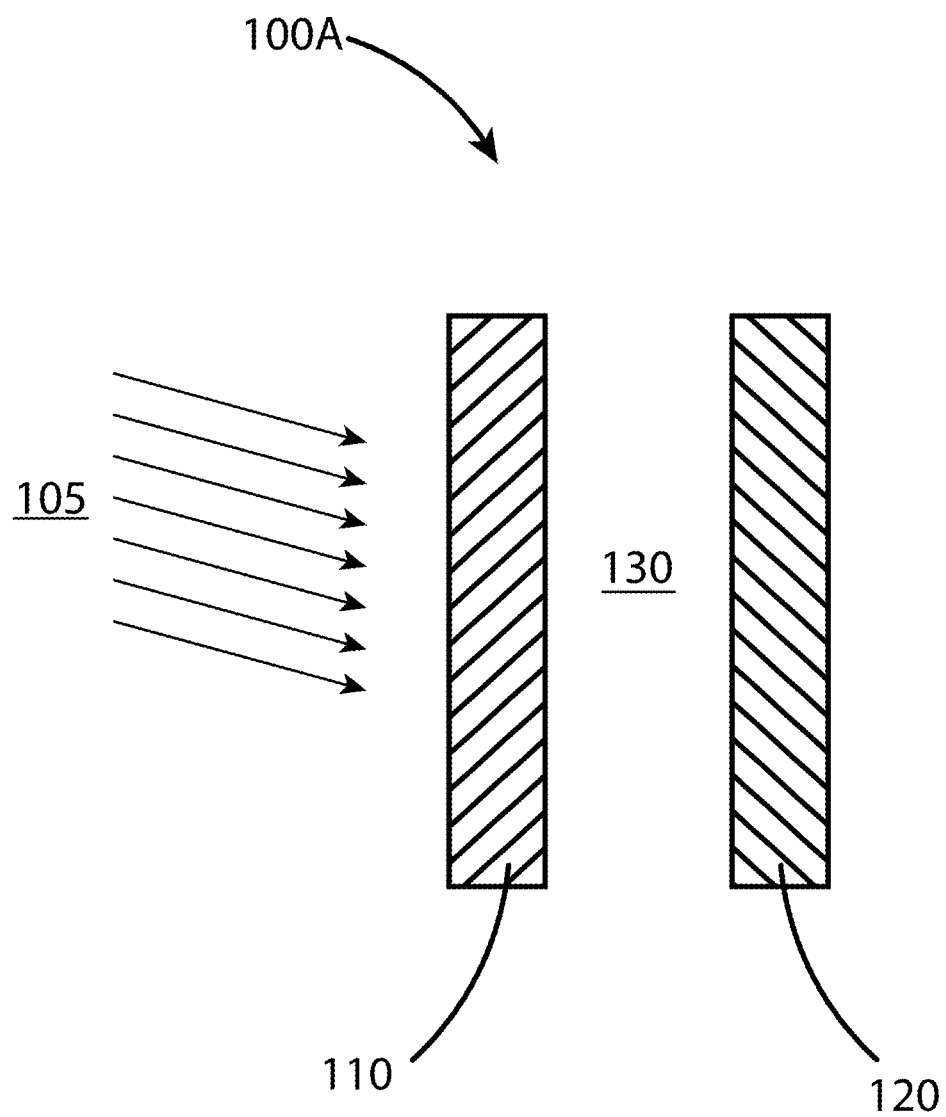
FIGS. 1A through 1F illustrate switchable photovoltaic devices (e.g. switchable windows), according to some embodiments of the present disclosure.

100 switchable window
105 light
110 switchable photovoltaic (PV) device
120 static PV device
130 gap
140 first layer
150 second layer
160 supporting structure
170 frame/housing
180 exterior environment
190 interior environment
195 integrated switchable/static PV device
210 active layer
220 charge transport layer
230 charge collecting layer
300 perovskite
310 A-cation
320 B-cation
330 X-anion
400 switchable window in transparent state
410 switchable window in colored/opaque state
415 complexing molecule
420 complexed perovskite
430 non-complexed perovskite
440 orthorhombic perovskite phase
450 cubic perovskite phase

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to improved photovoltaic devices, photo-emitting devices, thermochromic devices, cell phones, displays, and other electronic devices. In some embodiments of the present disclosure, materials, compositions, devices, and/or methods described herein may be provide improved windows, such as building windows and/or vehicle windshields. As described herein, in some embodiments of the present disclosure, a switchable window may include a tandem photovoltaic device with two or more features containing photovoltaic (PV) materials (i.e. layers containing photovoltaically active materials). For example, suitable PV materials for some embodiments of the present disclosure include perovskite materials (see FIGS. 3A, 3B, and 3C).

For example, a switchable window may include a first PV device containing a first PV material capable of reversibly switching between a colored state and a transparent state in response to a change in a local condition, such as at least one of a temperature, an electric field, a magnetic field, a light, a voltage, a current, etc. Further, a switchable window may include a second PV device containing a static (i.e. not switchable) PV material that remains transparent to at least a portion of the visible light spectrum, regardless of changes in the color/transparency of the switchable PV device. In some embodiments of the present disclosure, the two PV devices of a switchable window, the switchable device and the static device, may be combined into a monolithic two-terminal tandem device and/or a four-terminal device. In some embodiments of the present disclosure, the two PV devices, switchable and static, of a switchable window may be spatially separated or in direct physical contact with one another. Regardless, a switchable PV device and a static PV device will generate power when exposed to light, e.g. sun light, where the switchable PV device's power output may be variable depending on its state (transparent or opaque), whereas the static PV device's power output may be essentially constant regardless of the state of switchable PV device (for a given set of conditions).

As used herein, the term "switchable" refers to the ability to reversibly switch between at least two states at will (e.g. in response to a change in a control variable such as temperature, voltage, magnetic field, etc.). For the example of a switchable window or PV device, switchable refers to the ability to reversibly switch between a substantially transparent state and a relatively opaque state. As used herein, the term "static" refers to something that is substantially unchanging regardless of the local conditions. For the example of a static PV device, the term static refers to a relatively constant power output for a set of conditions and for any state that the switchable PV device is in.

FIGS. 1A, 1B, 1C, 1D, 1E, and 1F illustrate switchable, e.g. thermochromic, electrochromic, etc., windows, according to some embodiments of the present disclosure. FIG. 1A illustrates an exemplary switchable window 100A that includes a switchable PV device 110 and a static PV device 120 separated by a gap 130. Although this example illustrates a gap 130 between the two PV devices, in some embodiments of the present disclosure, a switchable PV device 110 and a static PV device 120 may be in physical contact with one another, with no intervening gap 130 present. As shown in FIG. 2, and described below, a switchable PV device 110 and/or a static PV device 120 may include multiple distinct layers stacked together, for example, at least one of an active layer (e.g. perovskite), a charge transport layer (CTL), and/or a charge collecting layer (CCL).

Referring again to FIG. 1A, a switchable PV device 110 may include a first PV material (e.g. a first perovskite; not shown) and a static PV device 120 may include a second PV material (e.g. a second perovskite; not shown), where the switchable PV device 110 and the static PV device 120 are positioned adjacent and substantially parallel to one another. The first PV material of the switchable PV device 110 may have a first state that is substantially transparent to a first wavelength of light from the visible spectrum and a second state this is substantially opaque to a second wavelength of light from the visible spectrum, where the first PV material can be reversibly switched between the first state and the second state, affected by a change in a control variable. In some embodiments of the present disclosure, when in the transparent first state, a first PV material of a switchable PV device 110 may be substantially transparent to visible light having a wavelength within the photopic eye response (wavelengths between about 380 nm and about 750 nm are visible to the human eye). In some embodiments of the present disclosure, when in the colored/opaque second state, a first PV material may be substantially opaque to light having a wavelength within the photopic eye response, between about 380 nm and about 750 nm.

In some embodiments of the present disclosure, the second PV material of a static PV device 120 may be substantially transparent to the visible spectrum of light while absorbing light outside of the visible spectrum, e.g. outside the range of the visible spectrum, e.g. outside of the range between about 495 nm and about 590 nm. For example, in some embodiments of the present disclosure, the second PV material of a static PV device 120 may absorb at least one of infrared light (wavelength between about 750 nm and about 1 mm) and our ultraviolet light (wavelength between about 100 nm and about 380 nm). FIG. 1A also illustrates the orientation of the switchable window 100A relative to incoming light 105; e.g. sun light.

Figure 1B:
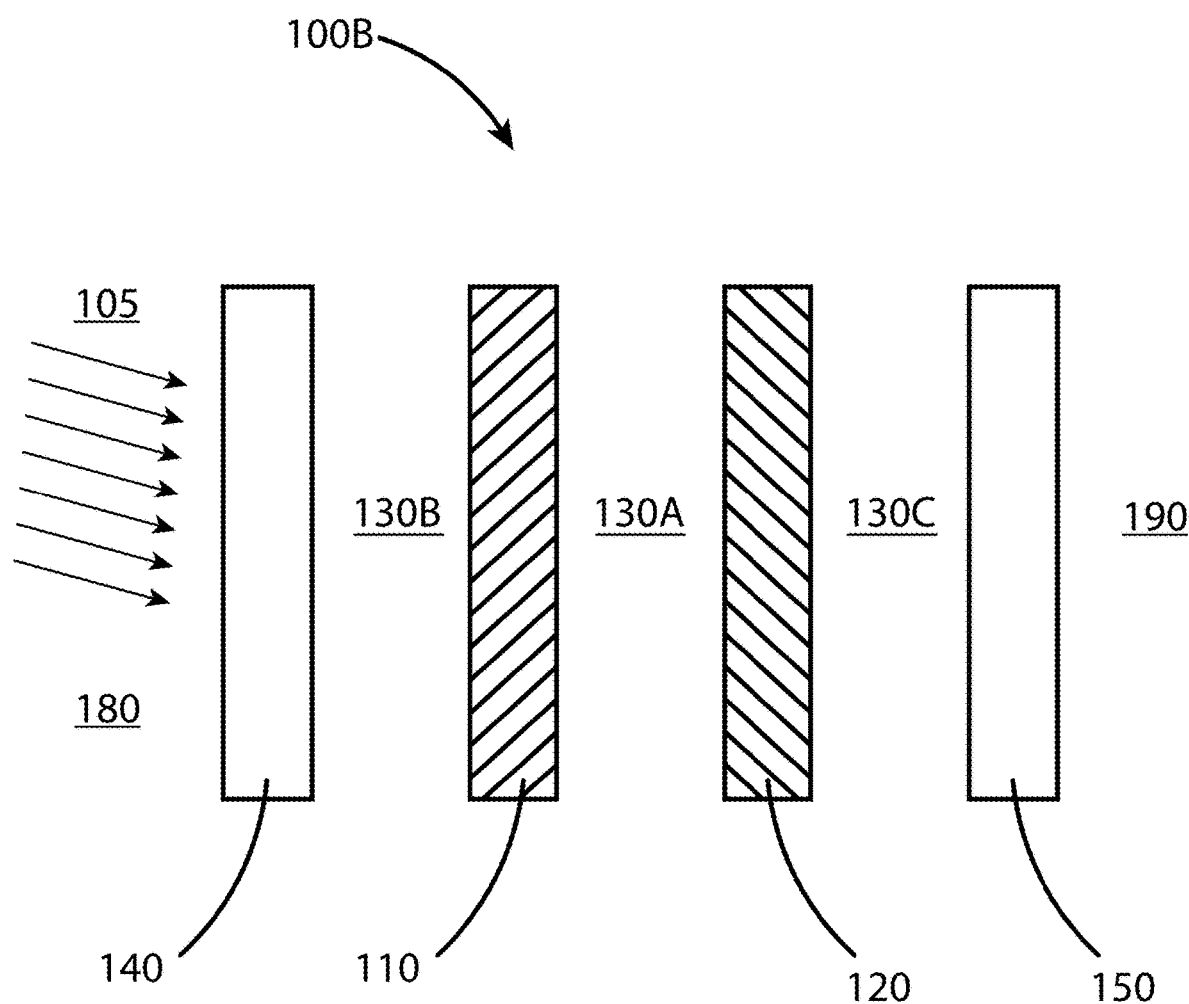

FIG. 1B illustrates a switchable window 100B that includes a switchable PV device 110 having a first PV material (not shown) and a static PV device 120 having a second PV material (not shown), as described above, where the switchable PV device 110 and the static PV device 120 are each positioned between a first layer 140 and a second layer 150. FIG. 1B also illustrates the orientation of this exemplary switchable window 100B relative to incoming light 105; e.g. sun light. In some embodiments of the present disclosure the first layer 140 and the second layer 150 may be constructed of a material that is transparent to visible light, such as glass, plexiglass, and/or a plastic such as polyethylene terephthalate, polyethylene naphtholate, polyester, and/or polyethylene. In addition, at least one of the first layer 140 and/or the second layer 150 may be transparent to the wavelength of light that is absorbed by the PV material of the static device 120; e.g. at least one of the first layer 140 and/or the second layer 150 may be transparent to at least one of infrared light and/or UV light. Clearly, both the first layer 140 and the second layer 150 should be transparent to visible light in order to illuminate the interior of a building, vehicle, etc. Among other things, a first layer 140 and a second layer 150 assist with physically isolating the switchable PV device 110 and the static PV device 120 from the environment; e.g. the exterior environment 180 (e.g. wind, rain, snow, etc.) and an interior environment 190 (e.g. a conference room, truck cab, etc.) FIG. 1B illustrates that in some embodiments of the present disclosure, a switchable window 100B may have more than one gap 130 positioned between its various components; e.g. switchable PV device 110, static PV device 120, first layer 140, and/or second layer 150. In this example, the switchable window 100B includes three gaps; a first gap 130A positioned between the switchable PV device 110 and the static PV device 120, a second gap 130B positioned between the first layer 140 and the switchable PV device 110, and a third gap 130C positioned between the static PV device 120 and the second layer 150. In some embodiments of the present disclosure, any one of the gaps (130A, 130B, and/or 130C) may be a substantially empty gap; e.g. not containing a gas, liquid, and/or solid. For example, a gap 130 may be at or close to absolute vacuum; e.g. at a pressure below one atmosphere of pressure (between $10^{-10}$ Torr and 620 Torr). In some embodiments, a gap 130 may contain a gas, for example, an inert gas such as nitrogen and/or a noble gas (e.g. He, Ar, Xe, etc.) at or above atmospheric pressure (between 620 Torr and 1200 Torr). In some embodiments of the present disclosure, a gap 130 between adjacent elements of a switchable window 100 (e.g. 110, 120, 140, and/or 150) may have a distance between 10 microns and 40 mm. In other embodiments, there may be no gap 130. A switchable element 110 may be direct contact with a static element 120. In another embodiment, switchable PV devices may be combined with static PV devices to create integrated hybrid PV devices domains in the size rage of 2 nm to 5 microns (see FIG. 1F).

Referring again to FIG. 1B, a switchable PV device 110 containing a first PV material may be separated from a first layer 140 by a second gap 130B. As shown, a first layer 140 may provide a barrier to the exterior environment 180. As shown, a static PV device 120 containing a second PV material may be separated from a second layer 150 (e.g. a glass layer) by a third gap 130C. As shown, a second layer 150 may provide a barrier to an interior environment 190. However, in some embodiments of the present disclosure, a switchable window 100 may not include any gap 130 between the various elements used to construct the switchable window 100. For example, a switchable PV device 110 may be in direct contact with at least one of a static PV device 120 and/or a first layer 140 and a static PV device 120 may be in direct contact with a switchable PV device 110 and/or a second layer 150.

Figure 1C:
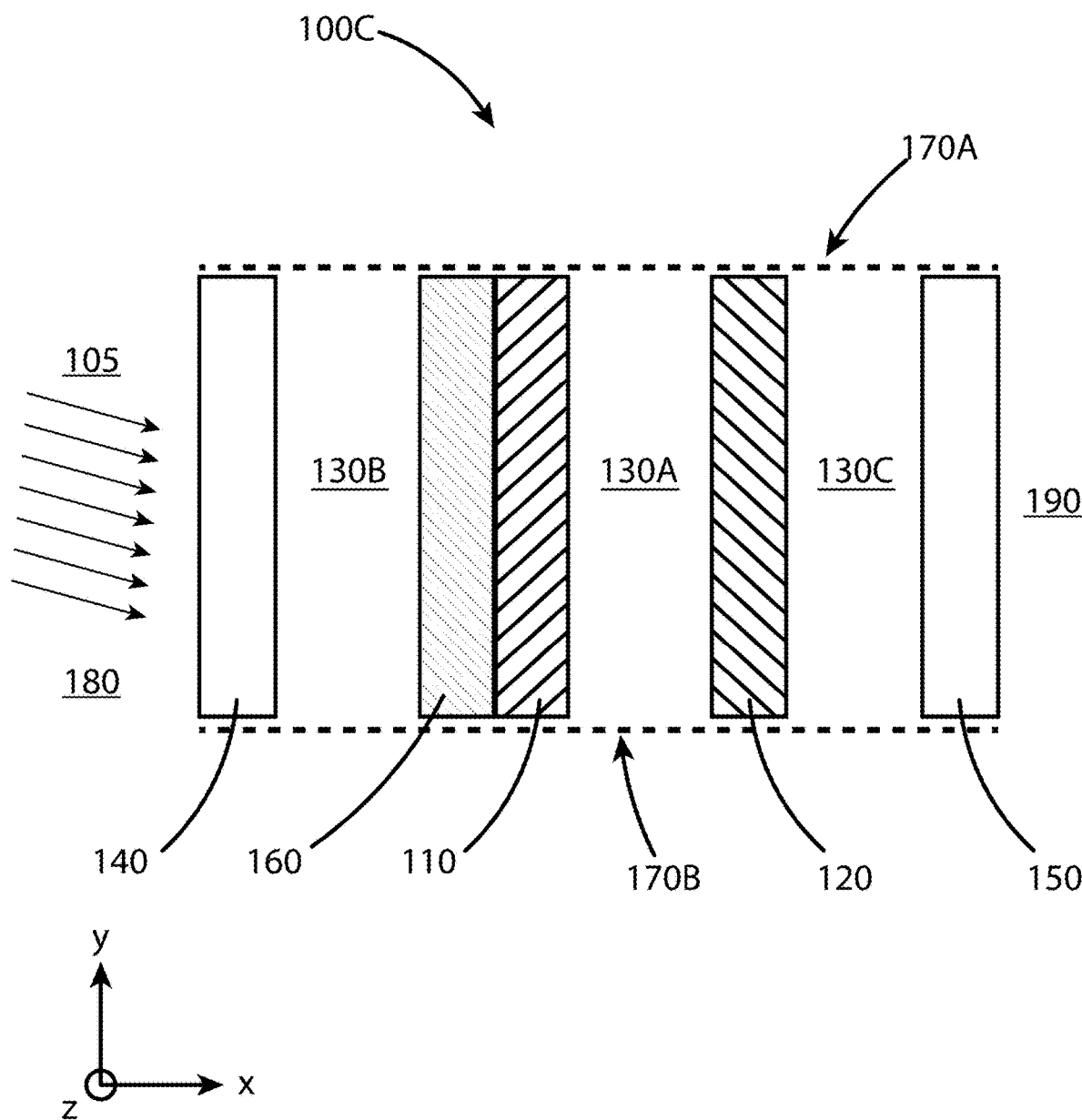

FIG. 1C illustrates a switchable window 100C, according to some embodiments of the present disclosure. In this exemplary switchable window 100C, the various elements (e.g. switchable PV device 110, static PV device 120, layers (140 and 150), and gaps (130A, 130B, and 130C) are positioned within a frame or housing 170. FIG. 1C illustrates that at least one of the switchable PV device 110 and/or the static PV device 120 may be physically attached or supported by the frame or housing 170. In some embodiments of the present disclosure, as shown in FIG. 1C, a frame/housing 170 may be constructed of more than one part; atop portion and a bottom portion are noted as reference numerals 170A and 170B, respectively. In some embodiments of the present disclosure, the outer facing elements, e.g. a first layer 140 and a second layer 150, may be integrated with a frame/housing 170 to create a seal between the internal elements (e.g. the switchable PV device 110 and the static PV device 120) of a switchable window 100C and the exterior environment 180 and/or interior environment 190.

In the example of FIG. 1C, a switchable PV device 110 may be physically supported by a supporting structure 160. Similarly, in some embodiments of the present disclosure, a static PV device 120 may be supported by a physically supporting structure (not shown). In some embodiments of the present disclosure, a single supporting structure 160 may be in physical contact and support both a switchable PV device 110 and a static PV device 120. In some embodiments of the present disclosure, a supporting structure 160 may be constructed of a material that is transparent to visible light such as glass, plexiglass, and/or a plastic. In addition, a supporting structure 160 may be transparent to a wavelength of light that is absorbed by at least one of the PV material of the switchable PV device 110 and/or the PV material of the static PV device 120; e.g. a support structure 160 may be transparent to at least one of infrared light and/or UV light. In some embodiments of the present disclosure, a support structure 160 may be constructed of one or more rods, columns, and/or wires oriented vertically and/or horizontally to form a grid with openings through which light may pass. Further, in some embodiments of the present disclosure, a support structure for elements of a window may include a layer (between 0.5 mm and 2.5 mm in thickness) of a transparent glue and/or sealant such as ethylene vinyl acetate (EVA), polyvinyl butyral (PVB), polyethylene, ethylene vinyl alcohol, and/or a polyolefin.

Referring again to FIG. 1C, a cross-section of a switchable window 100C is shown in the xy-plane. Thus, FIG. 1C (as do FIGS. 1A and 1B) illustrates the thicknesses of each element used to construct the switchable window 100C (e.g. reference numeral 110-170), in the x-direction, and the heights of each element or feature, in the y-direction. Each element also has a width dimension, in the z-direction. Thus, as shown in FIG. 1C, light from the exterior environment 180 (e.g. sun light) may be received at a first layer 140, where substantially all of the light is transmitted through the first layer 140, a first gap 130B, and a supporting structure 160. The remaining transmitted light (not shown) may then enter the switchable PV device 110 having the first PV material (e.g. perovskite), such that the first PV material absorbs (creating power) a portion of the visible spectrum of light. The remaining light (not shown), that is transmitted through the switchable PV device 110, may then pass through a second gap 130A to impinge on the static PV device 120 having the second PV material, such that at least a portion of this light (e.g. infrared light) is absorbed (creating power) by the second PV material. The remaining transmitted light (not shown), for example, at least portions of the visible light spectrum, may then pass through a third gap 130C and a second layer 150 (e.g. glass) into an interior environment 190 (e.g. a room or vehicle). The transmitted light may also enter an adjacent optical and/or optoelectronic device (e.g. lens, photodetector, etc.)

Figure 1D:
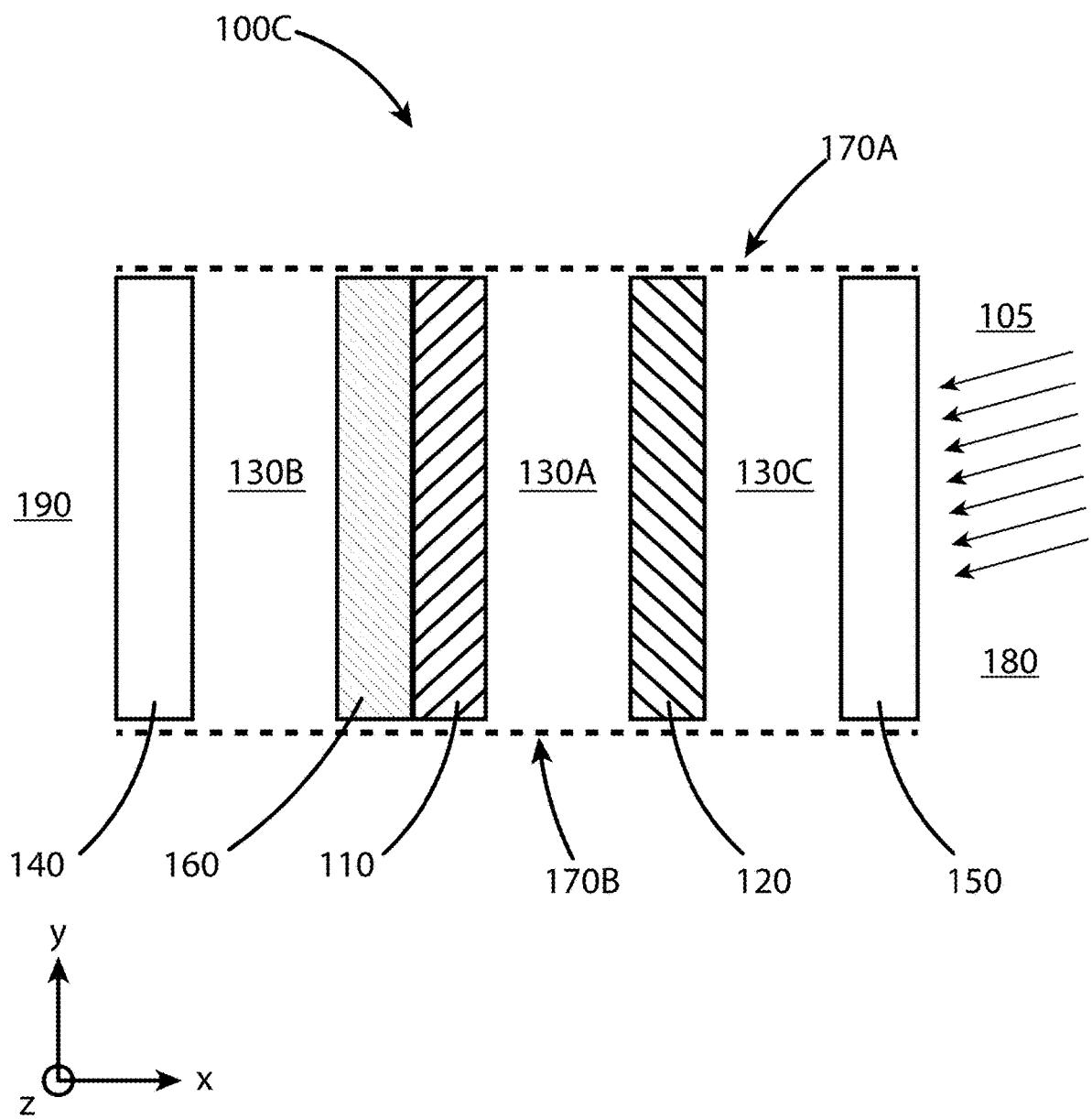

In some embodiments of the present disclosure, a static PV device 120 may receive light before the switchable PV device 130. For example, FIG. 1D illustrates an embodiment of the present disclosure, where light may be received from an exterior environment 180 by a second layer 150, where substantially all of the light is transmitted through the second layer 150 and a gap 130C. The remaining transmitted light (not shown) may then enter a static PV device 120 having a PV material, such that the PV material absorbs at least a portion of the visible spectrum of light, for example ultraviolet light. The remaining light (not shown), that is transmitted through the static PV device 120, may then impinge on a switchable PV device 110 having a PV material, such that at least a portion of the visible light spectrum is absorbed by the PV material. The remaining transmitted light (not shown), for example, at least portions of the visible light spectrum, may then pass through a supporting structure 160, a gap 130B, and a first layer 140 (e.g. glass) into an interior environment 190 (e.g. a room or vehicle).

Figure 1E:
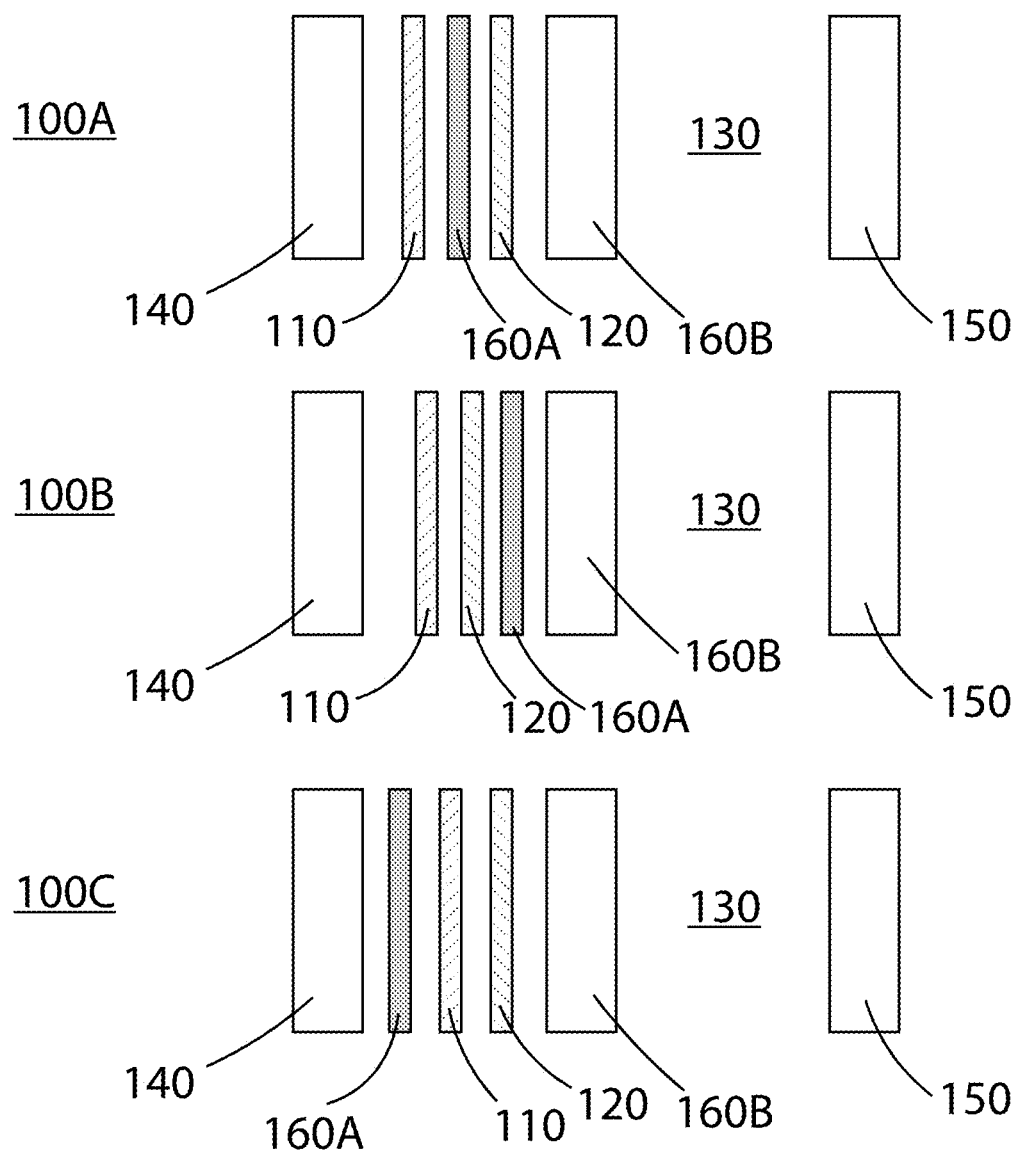
Figure 1F:
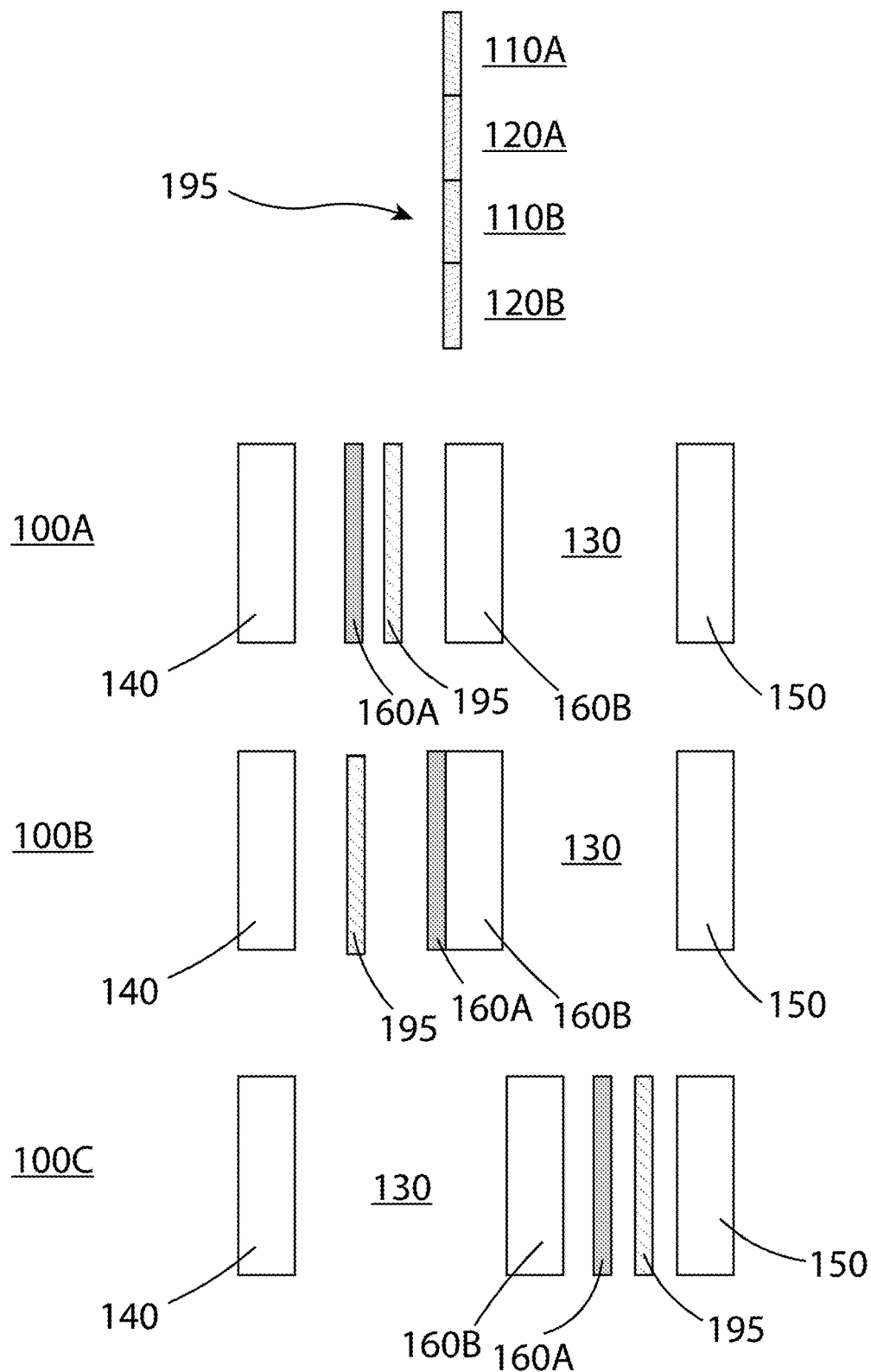
Figure 2:
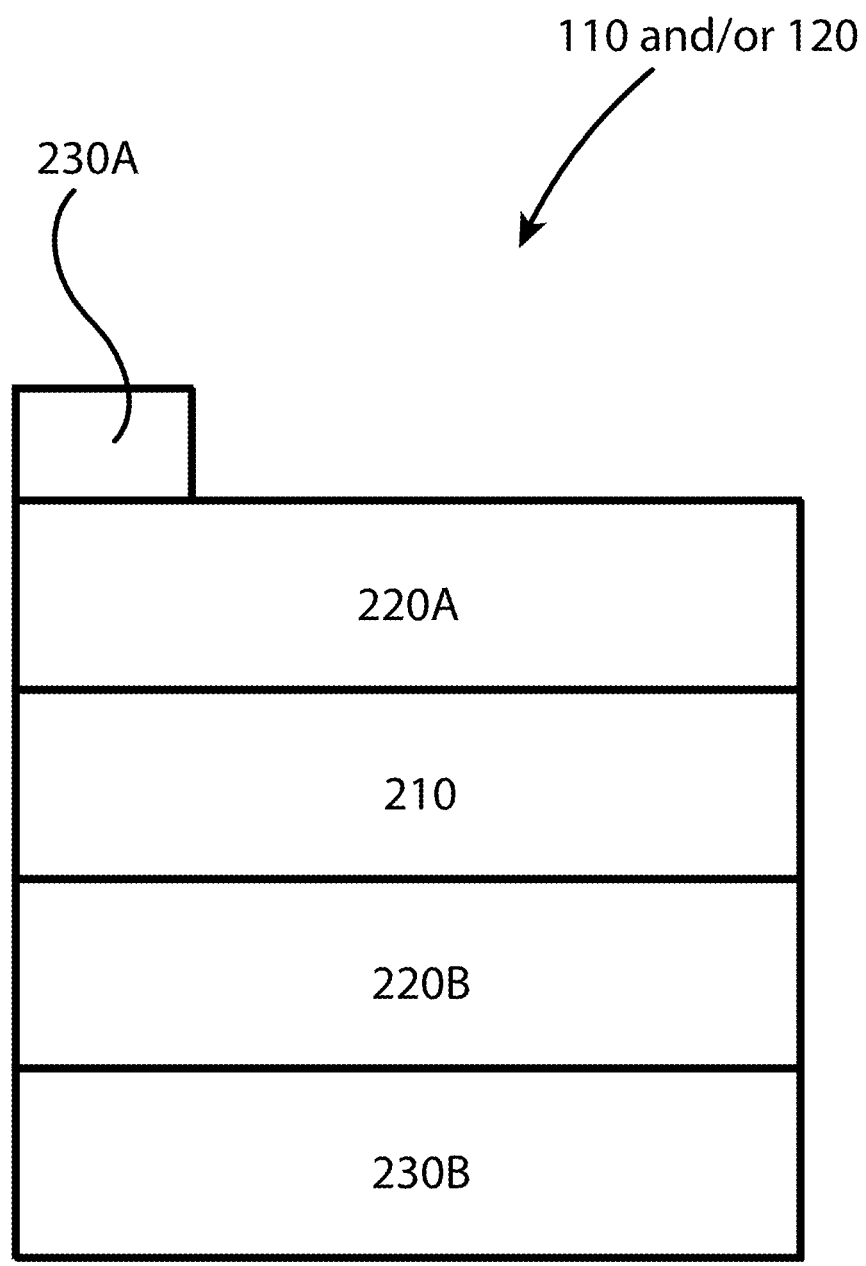
FIG. 2 illustrates an example of a PV device, switchable or static of the exemplary devices shown in FIGS. 1A through 1F, according to some embodiments of the present disclosure.

FIG. 1E illustrates switchable windows having various configurations of switchable PV devices 110, static PV devices 120, gaps 130, and glass layers (e.g. first layer 140, second layer 150, and/or support structure 160), according to some embodiments of the present disclosure. In these examples, each switchable window 100 includes a switchable PV device 110, a static PV device 120, a first outer facing glass layer (i.e. first layer 140), a second outer facing glass layer (i.e. second layer 150), a transparent glue or sealing layer (i.e. a first supporting structure 160A), and an internal glass layer (e.g. a second supporting structure 160B). Each of the elements of each of the exemplary switchable windows may also be positioned in a frame/housing (not shown). Also, although only one gap 130 is specifically referenced in each exemplary switchable window 100, any two adjacent elements may be in physical contact or separated by a gap 130. As illustrated in FIG. 1F, in some embodiments of the present disclosure, multiple switchable PV devices 110 may be combined into a single plane with multiple static PV devices 120, referred to herein as an integrated switchable/static PV device 195. FIG. 1F illustrates some embodiments of the present disclosure, of how an integrated switchable/static PV device 195 may be utilized in a switchable window 100. FIG. 1F illustrates (top) an integrated switchable/static PV device 195 having two switchable PV devices (110A and 110B) integrated in alternating fashion with two static PV devices (120A and 120B). This is for illustrative purposes, and in some embodiments of the present disclosure an integrated switchable/static PV device 195 may have between 2 and 20 of each switchable PV devices 110 and static PV devices 120.

FIG. 2 illustrates an example of a switchable PV device 110 and/or a static PV device 120 of the exemplary switchable windows 100 shown in FIGS. 1A-IC, according to some embodiments of the present disclosure. Either a switchable PV device 110 and/or a second PV device 120 may include an active layer 210 (e.g. perovskite) positioned between a first charge transport layer 220A and a second charge transport layer 220B. A switchable PV device 110 and/or a static PV device 120 may also include a first charge collecting layer 230A in electrical communication with the first charge transport layer 220A, and a second charge collecting layer 230B in electrical communication with the second charge transport layer 220B. In some embodiments of the present disclosure, an active layer 210 may absorb light to generate a voltage and/or a current, or an active layer 210 may emit light when a voltage and/or current is applied to the active layer 210. The active layer 210 may include at least one of a bulk inorganic semiconductor layer (silicon, germanium gallium arsenide, cadmium telluride, lead sulfide, etc.), an organic-inorganic semiconductor layer (e.g. methylammonium lead iodide), an organic semiconductor layer (e.g. conjugated polymers such as polyacetylene, phthalocyanine, polyethylene terephthalate, poly(3,4-ethylenedioxythiophene), poly(3-methyl-thiophene), poly(3-hexylthiophene) and fullerenes (C60, C70, etc.), their derivatives (phenyl-C61-butyric acid methyl ester, thienyl-$C_{61}$-butyric-acid-methyl ester, etc.), as well as bulk or planar heterojunctions composing a number of these components, and/or semiconductor quantum dots (e.g. silicon, germanium gallium arsenide, cadmium telluride, lead sulfide, cadmium selenide, etc.). The example of FIG. 2 illustrates only one active layer 210. However, it is to be understood that a such a device may include one or more active layers, for example, stacked on top of each other to maximize the amount of the sun's energy that is converted to electricity in a photovoltaic device.

In general, a charge transport layer 220 (220A and/or 220B) may be a hole transport layer or an electron transfer layer to enable the generation of charge separation within the first layer 110 and/or second layer 120. In some embodiments of the present disclosure, at least one of the first charge transport layer 220A and/or the second charge transport layer 220B may include a single-walled carbon nanotube (SWCNT) and/or multi-walled carbon nanotube (MWCNT) layer. As used herein, "CNT" includes SWCNTs and MWCNTs. A CNT layer may be doped and/or wrapped in a polymer. The doping may include immersing the SWCNT network in a solution comprising a charge-transfer dopant until a charge carrier (electron or hole) doping level of the SWCNT network is saturated; e.g. having a carrier density between $1 \times 10^{19}$ and $1 \times 10^{21}$ per cubic centimeter. The charge carrier doping level of the SWCNT network can be further tuned by immersing the SWCNT network in a solvent to intentionally re-dissolve some of the adsorbed dopant. The charge-transfer dopant may include at least one of triethyloxonium hexachloroantimonate (OA, a p-type dopant), 2,3,5,6-Tetrafluoro-7,7,8,8-tetracyanoquinodimethane ($F_4$TCNQ, a p-type dopant), amines (ammonia, primary, secondary, and tertiary alkyl- or arylamines, n-type dopants), phosphines (n-type dopants), and/or alkali crown ether complexes (n-type dopants). Carbon substitution dopants, such as nitrogen or boron, may also be employed.

In general, a charge collecting layer 230 (230A and/or 230B) may be any suitable, highly conductive material that enables the removal of the charges generated in or provided to the active layer 210. In some embodiments of the present disclosure, at least one of the first charge collecting layer 230A and/or the second charge collecting layer 230B may include at least one of the CNT combinations described above for the charge transport layers (220A and 220B) with a higher dopant density. The specific number, combination, and order of the various layers of a specific first layer 110 and/or second layer 120 will be dictated by the specific use and/or design requirements of the device.

In some embodiments of the present disclosure, a switchable window 100 may include a switchable PV device 110 constructed of a stack of elements as described in order with thicknesses provide in square brackets: a first charge collecting layer 230A of fluorine-doped tin oxide (FTO) [200 nm], a first charge transport layer 220A of tin oxide ($SnO_2$) and/or titanium oxide ($TiO_2$) [50 nm], an active layer 210 (e.g. perovskite) [10 nm to 1000 nm], a second charge transport layer 220B of nickel oxide [50 nm], and a second charge collecting layer 230B of indium tin oxide [200 nm]. As described in detail below, this exemplary combination of elements/materials was mathematically modeled to demonstrate their feasibility as a switchable window 100.

A perovskite may be composed of three-dimensional (3D) MHPs, which has corner-sharing $[MX_6]^{4-}$ octahedra ($M=Pb^{2+}$, $Sn^{2+}$; $X=I^-$, $Br^-$, $Cl^-$) that form an isotropic inorganic framework separated by A-site organic (ammonium derivative such as methylammonium, formamidinium, or quanadinium) or inorganic (alkali metal such as $Cs^+$ or $Rb^+$) monovalent cations. 2D MHPs also exhibit corner-sharing $[MX_6]^{4-}$ octahedra but only in two dimensions with the third dimension separated in space by the A-site cation. 2D MHPs are classified as Ruddlesden-Popper (RP) or Dion-Jacobson (DJ) phases of the general formula $A'_2A_{n-1}M_nX_{3n+1}$ or $A'A_{n-1}M_nX_{3n+1}$, respectively, where $A'=1+$ or $2+$ cation, $A=1+$ cation, and $n=1, 2, 3, \ldots \infty$ is the number of connected 2D octahedra layers. Zero-dimensional perovskites had the general form $A_4MX_6$.

In addition, the switchable window may include a static PV device 120 constructed of a stack of elements as described in order: a first charge collecting layer 230A of fluorine-doped tin oxide (FTO) [200 nm], a first charge transport layer 220A of tin oxide ($SnO_2$) and/or titanium oxide ($TiO_2$) [50 nm], an active layer 210 (e.g. perovskite or a wavelength-selective organic material) [10 nm to 1000 nm], a second charge transport layer 220B of nickel oxide [50 nm], and a second charge collecting layer 230B of indium tin oxide [200 nm]. The active layer may selectively absorb UV light (<370 nm). Examples of the UV-absorber include oxide and halide perovskites material such as cesium lead chloride, methylammonium tin chloride, and methylammonium lead bromide chloride. The static layer may also be composed of an organic compound with selective infrared (>650 nm) absorption. As described in detail below, this exemplary combination of elements/materials was mathematically modeled to demonstrate their feasibility as a switchable window 100.

Organic compounds include: polymer donor poly[2,6'-4, 8-di(5-ethylhexylthienyl)benzo[1,2-b;3,3-b[dithiophene]-alt-[3-fluoro-2[(2-ethylhexyl)carbonyl]thieno[3,4-b[thiophenediyl] (PTB7-Th), fullerene acceptor [6,6]-phenyl-C71-butyric acid methyl ester ($PC_{71}BM$) and non-fullerene acceptor 2,2'-((2Z,2'Z)-(((4,4,9,9-tetrakis(4-hexylphenyl)-4, 9-dihydro-sindaceno[1,2-b:5,6-b']dithiophene-2,7-diyl)bis (4-((2-ethylhexyl)oxy)thiophene-5,2-diyl))bis(methanylylidene))bis(5,6-difluoro-3-oxo-2,3-dihydro-1H-indene-2, 1-diylidene))dimalononitrile (IEICO-4F). It may also be an organic salt cation (1-Butyl-2-(2-3-2-(1-butyl-1H-benzo[cd] indol-2-ylidene)-ethylidene-2-phenylcyclopent-1-enyl-vinyl)-benzo[cd]indolium) paired with $BF_4$ (anion) or small molecule compounds such as chloroaluminum phthalocyanine. Carbon nanotubes are also a possible wavelength selective absorber that could be used.

Figure 3A:
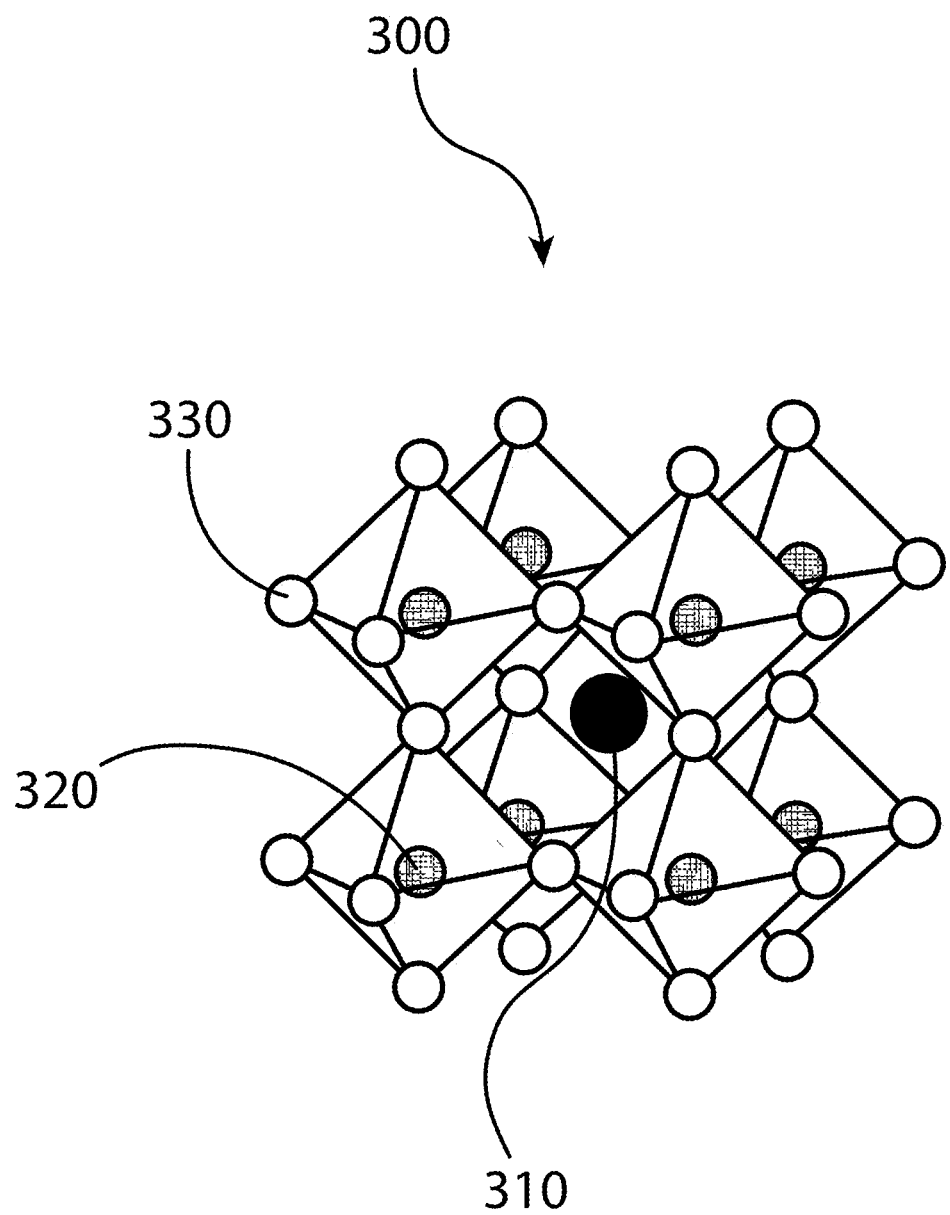
FIGS. 3A through 3C illustrate the structure of a perovskite, according to some embodiments of the present disclosure.
Figure 3B:
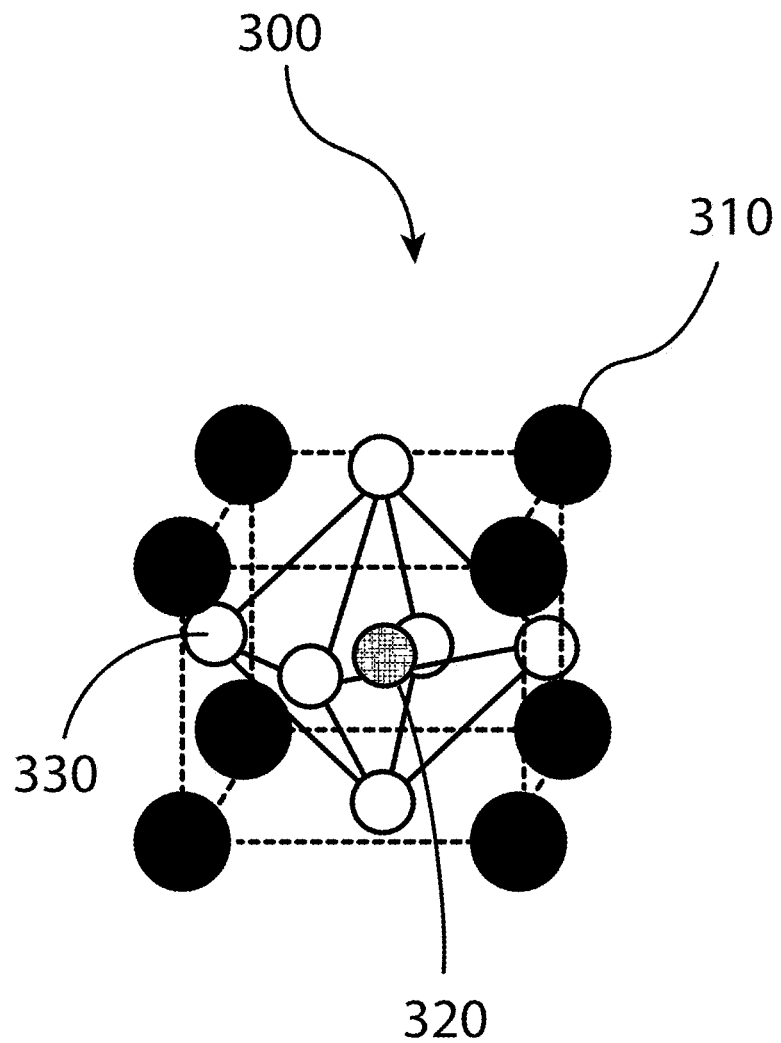
Figure 3C:
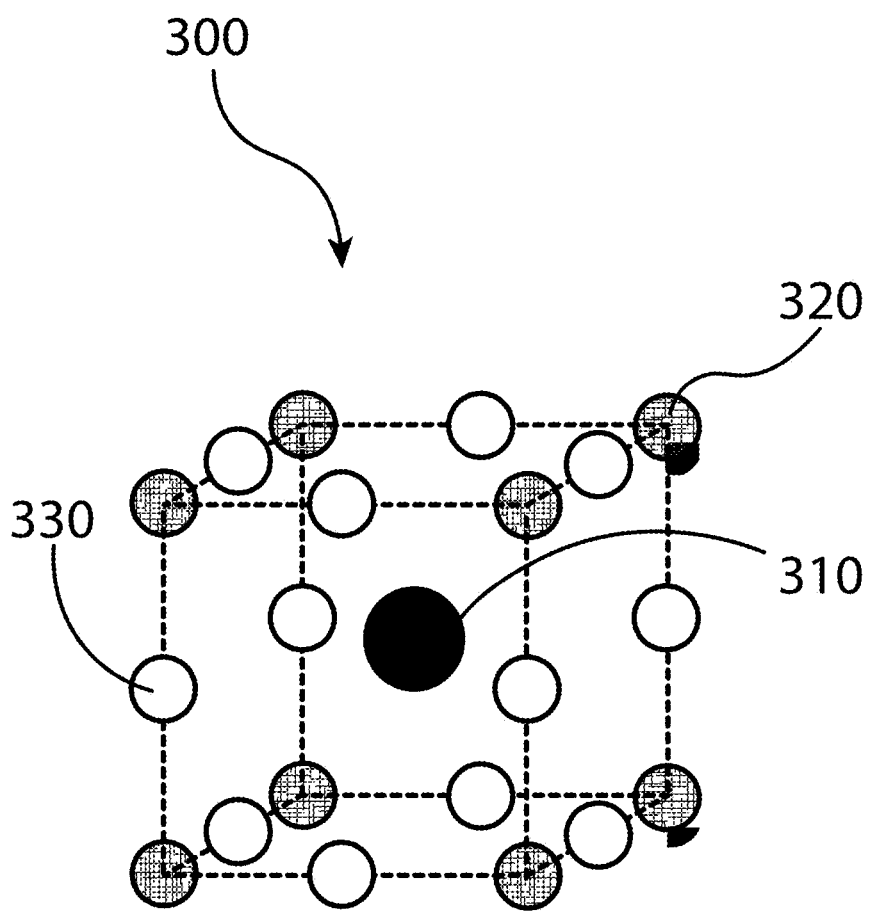

FIGS. 3A, 3B, and 3C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (330) is an anion and A (310) and B (320) are cations, typically of different sizes (A typically larger than B). FIG. 3A illustrates that a perovskite 300 may be organized into eight octahedra surrounding a central A-cation 310, where each octahedra is formed by six X-anions 330 surrounding a central B-cation 320. FIG. 3B illustrates that a perovskite 300 may be visualized as a cubic unit cell, where the B-cation 320 is positioned at the center of the cube, an A-cation 310 is positioned at each corner of the cube, and an X-anion 330 is face-centered on each face of the cube. FIG. 3C illustrates that a perovskite 100 may also be visualized as a cubic unit cell, where the B-cation 320 resides at the eight corners of a cube, while the A-cation 310 is located at the center of the cube and with 12 X-anions centrally located between B-cations along each edge of the unit cell. For both unit cells illustrated in FIGS. 3B and 3C, the A-cations 310, the B-cations 320, and the X-anions 330 balance to the general formula $ABX_3$, after accounting for the fractions of each atom shared with neighboring unit cells. For example, referring to FIG. 3B, the single B-cation 320 atom is not shared with any of the neighboring unit cells. However, each of the six X-anions 330 is shared between two unit cells, and each of the eight A-cations 310 is shared between eight unit cells. So, for the unit cell shown in FIG. 3B, the stoichiometry simplifies to B=1, A=8*0.124=1, and X=6*0.5=3, or $ABX_3$. Similarly, referring again to FIG. 3C, since the A-cation is centrally positioned, it is not shared with any of the unit cells neighbors. However, each of the 12 X-anions 330 is shared between four neighboring unit cells, and each of the eight B-cations 320 is shared between eight neighboring unit cells, resulting in A=1, B=8 *0.125=1, and X=12*0.25=3, or $ABX_3$. Referring again to FIG. 3C, the X-anions 330 and the B-cations 320 are shown as aligned along an axis; e.g. where the angle at the X-anion 330 between two neighboring B-cations 320 is exactly 180 degrees, referred to herein as the tilt angle. However, a perovskite 300 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 310 may include a nitrogen-containing organic compound such as an alkyl ammonium compound. The B-cation 320 may include a metal and the X-anion 330 may include a halogen. Additional examples for the A-cation 310 include organic cations and/or inorganic cations, for example Cs, Rb, K, Na, Li, and/or Fr. Organic A-cations 310 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 310 include methylammonium ($CH_3NH_3^+$), ethylammonium ($CH_3CH_2NH_3^+$), propylammonium ($CH_3CH_2 CH_2NH_3^+$), butylammonium ($CH_3CH_2 CH_2 CH_2NH_3^+$), formamidinium ($NH_2CH=NH_2^+$), hydrazinium, acetylammonium, dimethylammonium, imidazolium, guanidinium and/or any other suitable nitrogen-containing or organic compound. In other examples, an A-cation 310 may include an alkylamine. Thus, an A-cation 310 may include an organic component with one or more amine groups. For example, an A-cation 310 may be an alkyl diamine halide such as formamidinium ($CH(NH_2)_2$). Thus, the A-cation 310 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 320 include, for example, lead, tin, germanium, and or any other 2+ valence state metal that can charge-balance the perovskite 300. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 330 include halogens: e.g. fluorine, chlorine, bromine, iodine and/or astatine. In some cases, the perovskite halide may include more than one X-anion 330, for example pairs of halogens; chlorine and iodine, bromine and iodine, and/or any other suitable pairing of halogens. In other cases, the perovskite 300 may include two or more halogens of fluorine, chlorine, bromine, iodine, and/or astatine.

Thus, the A-cation 310, the B-cations 320, and X-anion 330 may be selected within the general formula of $ABX_3$ to produce a wide variety of perovskites 300, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 300 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks; e.g. having the stoichiometry of $A_4BX_6$, possessing the same unit structure. As described herein, the A-cation 310 of a perovskite 300, may include one or more A-cations, for example, one or more of cesium, FA, MA, etc. Similarly, the B-cation 320 of a perovskite 300, may include one or more B-cations, for example, one or more of lead, tin, germanium, etc. Similarly, the X-anion 330 of a perovskite 300 may include one or more anions, for example, one or more halogens. Any combination is possible provided that the charges balance.

For example, a perovskite having the basic crystal structure illustrated in FIG. 3A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 4A:
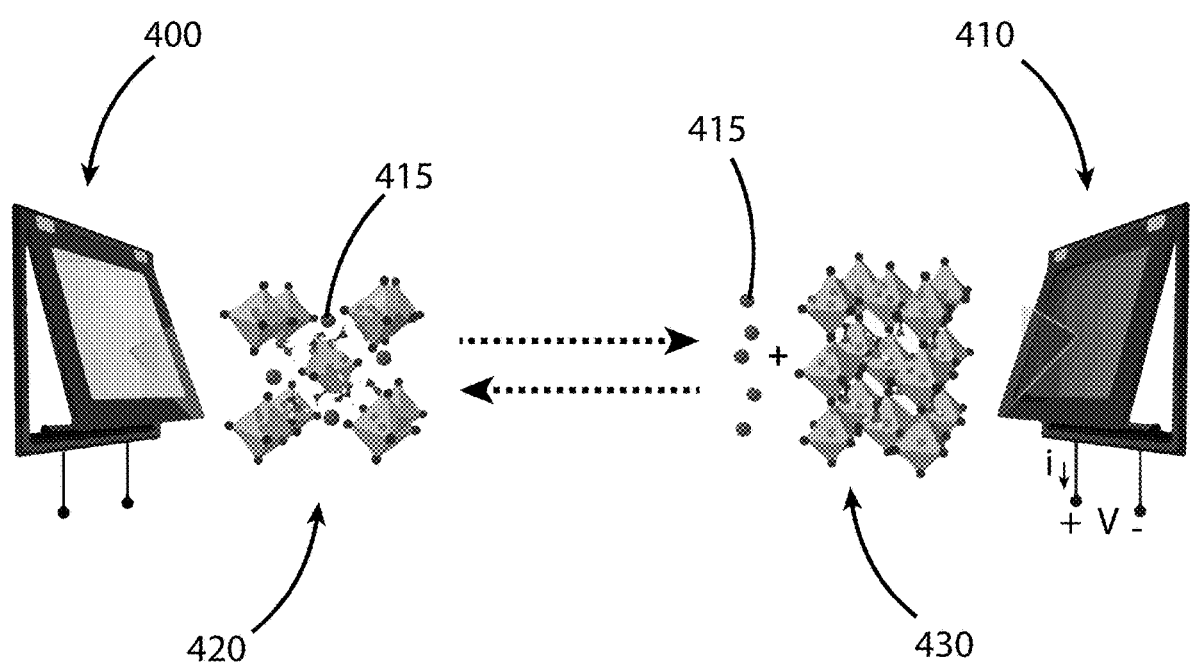
FIG. 4A illustrates an intercalation switching mechanism, according to some embodiments of the present disclosure, where complexing molecules are reversibly intercalated into a perovskite (e.g. metal halide perovskite—MHP) absorber layer in response to photo-thermal heating and cooling.
Figure 4B:
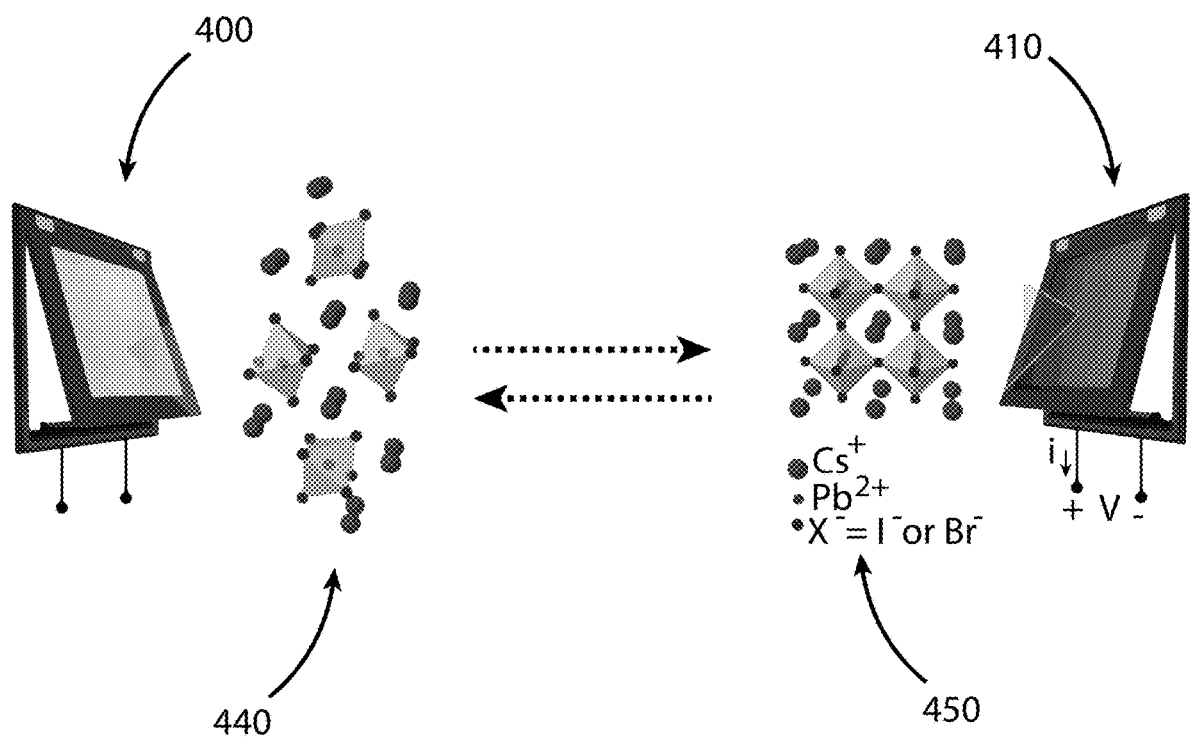
FIG. 4B illustrates a phase switching mechanism, according to some embodiments of the present disclosure, where the crystal structure is reversibly changed between an orthorhombic phase (left) and a cubic phase (right).

FIGS. 4A and 4B are described below and illustrate one possible switching mechanism for switching a perovskite between a first substantially transparent state to a second relatively opaque state. This is for illustrative purposes only, and other mechanisms for reversibly switching a perovskite (or some other active material) fall within the scope of the present disclosure. Thus, FIG. 4A demonstrates a basic operating principle of a switchable window, according to some embodiments of the present disclosure, which is based on perovskite absorber layers, for example metal halide perovskite layers, which have demonstrated PCEs higher than 22%. Perovskite materials will readily form a complex with gas phase complexing molecules 415 (e.g. methylamine) that switch the material properties from strongly absorbing (e.g. opaque) in the visible region to visibly transparent. A complexed perovskite 420 corresponding to the bleached/transparent state is shown on the left side of FIG. 4A. The complexing molecule 415 dissociates from the perovskite with heat from the sun, resulting in the WIPV switching to the colored state 410 having a non-complexed perovskite 430, corresponding to the right side of FIG. 4A. As shown herein, some embodiments of the present disclosure have shown colored-to-bleached switching at ~40° C., which is easily accessible by solar photo-thermal heating. In addition, the temperatures at which switching occurs from the complexed perovskite 420 state (bleached) to the non-complexed perovskite 430 state (colored) may be increased or decreased by increasing or decreasing the partial pressure of the complexing molecule, respectively, for example, the partial pressure of methylamine may be varied between 5 Torr and 760 Torr. The two dashed arrows shown in FIG. 4A indicate the reversible switching, as a result of temperature changes, between the window in the transparent state 400 and the window in the colored state.

A second mechanism for a switchable window is achieved through an orthorhombic-to-cubic phase transition of a perovskite, as illustrated in FIG. 4B. The reversible phase change of cesium lead bromide iodide ($CsPbI_2Br$) has been demonstrated for this mechanism, one example within the large family of perovskites. $CsPbI_2Br$ films can be produced from solution and crystallized at 100° C. to yield the cubic perovskite phase 450 that is brown-black in appearance and leads to switchable window in a colored state 410 of FIG. 4B. The cubic phase is metastable at room temperature. It may be switched to the thermodynamically favored bleached orthorhombic perovskite phase 440 and a switchable window in a transparent state 400, corresponding to the left-hand side of FIG. 4B, by switching the environment that the perovskite film is in, for example, from an essentially pure $N_2$ environment to an air. The phase change can occur within less than 10 minutes.

Mathematical modeling was completed to demonstrate the feasibility of the switchable windows described above using the switchable window constructed of a switchable PV device 110 constructed of a stack of elements as described below in order with thicknesses provided in square brackets: a first charge collecting layer 230A of fluorine-doped tin oxide (FTO) [200 nm], a first charge transport layer 220A of tin oxide ($SnO_2$) and/or titanium oxide ($TiO_2$) [50 mm], an active layer 210 (e.g. perovskite) [10 nm to 1000 nm], a second charge transport layer 220B of nickel oxide [50 nm], and a second charge collecting layer 230B of indium tin oxide [200 nm]. The composition of the modeled switchable perovskite active layer was methylammonium lead iodide. In addition, the modeled switchable window included a static PV device 120 constructed of a stack of elements as described below in order: a first charge collecting layer 230A of fluorine-doped tin oxide (FTO) [200 nm], a first charge transport layer 220A of tin oxide ($SnO_2$) and/or titanium oxide ($TiO_2$) [50 mm], an active layer 210 (e.g. perovskite) [10 nm to 1000 nm], a second charge transport layer 220B of nickel oxide [50 nm], and a second charge collecting layer 230B of indium tin oxide [200 nm]. The static PV device's active layer was a blend of poly[2,6'-4,8-di(5-ethylhexylthienyl)benzo[1,2-b;3,3-b[dithiophene]-alt-[3-fluoro-2[(2-ethylhexyl)carbonyl]thieno[3,4-b[thiophenediyl] (PTB7-Th), fullerene acceptor [6,6]-phenyl-C71-butyric acid methyl ester ($PC_{71}BM$) and non-fullerene acceptor 2,2'-((2Z,2'Z)-(((4,4,9,9-tetrakis(4-hexylphenyl)-4,9-dihydro-sindaceno[1,2-b:5,6-b']dithiophene-2,7-diyl)bis(4-((2-ethylhexyl)oxy)thiophene-5,2-diyl))bis(methanylylidene))bis(5,6-difluoro-3-oxo-2,3-dihydro-1H-indene-2,1-diylidene))dimalononitrile (IEICO-4F). As described in detail below, this exemplary combination of elements/materials was mathematically modeled to demonstrate their specific feasibility as a switchable window 100, as well as the general concept of a switchable window containing a tandem PV system.

The modeling of this exemplary switchable window was determined by the radiative limit defined by the following equations:

$$J = q(N_G - N_R)$$

$$N_G = \int_0^\infty \Gamma(E) EQE(E) dE$$

$$N_R = \frac{2\pi}{c^2 \hbar^3} \int_0^\infty \frac{EQE(E) E^2}{\exp\left[\frac{E-qV}{kT}\right] - 1} dE$$

$$PCE = \frac{(JV)_{Max}}{P_{Sun}}$$

$$P_{Sun} = \int_0^\infty E\Gamma(E) dE$$

where J is the solar cell electrical current [A cm$^{-2}$], q is the elementary charge, $N_G$ is the electron-hole pair generation current density [m$^{-2}$ s$^{-1}$ eV$^{-1}$], and $N_R$ is the electron-hole pair recombination current density, and $\Gamma(E)$ is solar photon flux [m$^{-2}$ s$^{-1}$ eV$^{-1}$]. The AM1.5 spectrum from NREL was utilized. The recombination current density, $N_R$, is defined by a generalization of Kirchhoff's and Planck's laws and is valid for materials that are neither black nor have a single Fermi distribution over all states. c is the speed of light, h is Plank's constant, k is the Boltzmann constant, V is voltage, and T is the temperature of the solar cell. The emissivity of a homogenous semiconductor is equal to the absorptance of the photoactive layer of the device. Here the absorptance is equal to the external quantum efficiency (EQE(E)) of the device was modeled with custom code. This code used the transfer matrix method to determine absorption, reflection, and transmission of the device as a function of energy (E) or wavelength. FIG. 5-8 illustrated the modeling results of configuration 100A illustrated in FIG. 1E, utilizing the specific materials described above.

Figure 5:
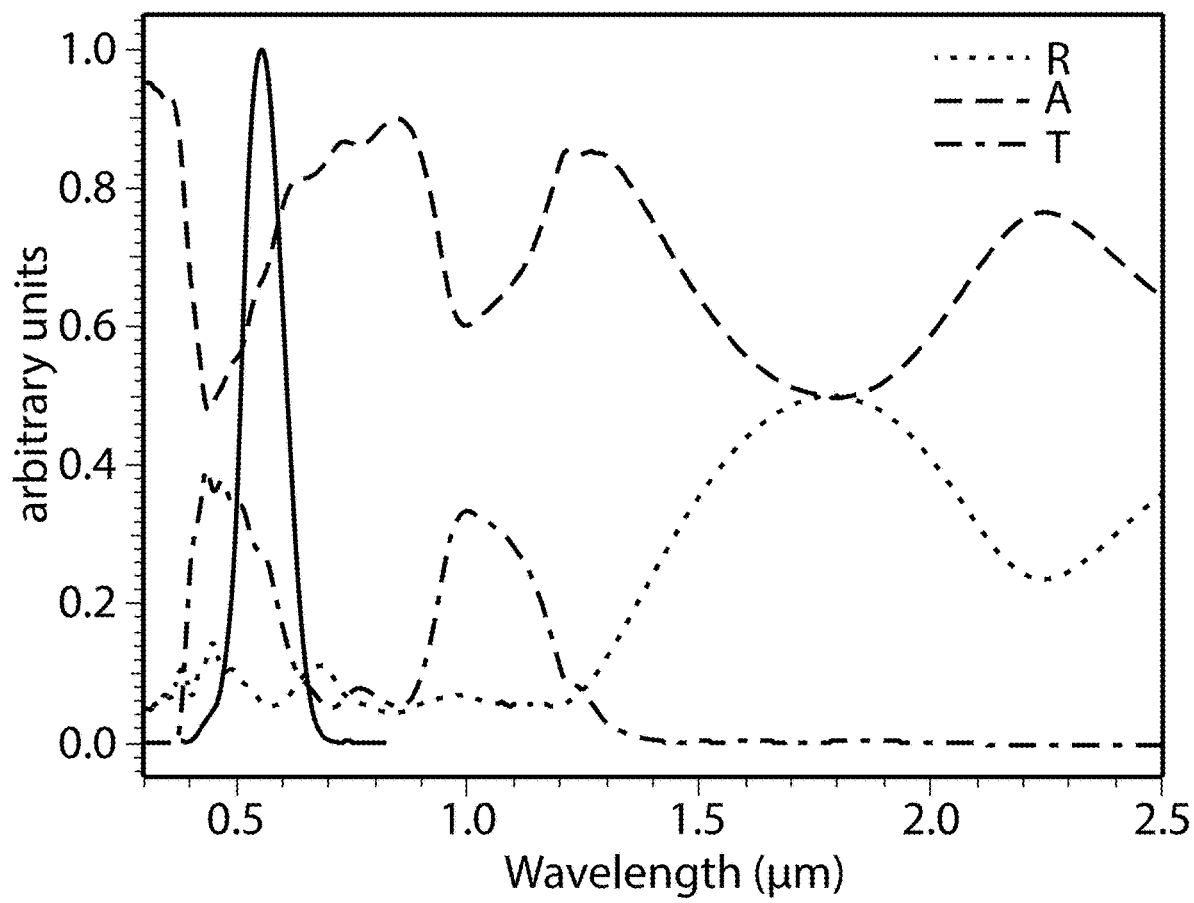
FIG. 5 illustrates the reflection (R), the absorption (A), and transmission (T) of and exemplary switchable window in the transparent state, according to some embodiments of the present disclosure.
Figure 6:
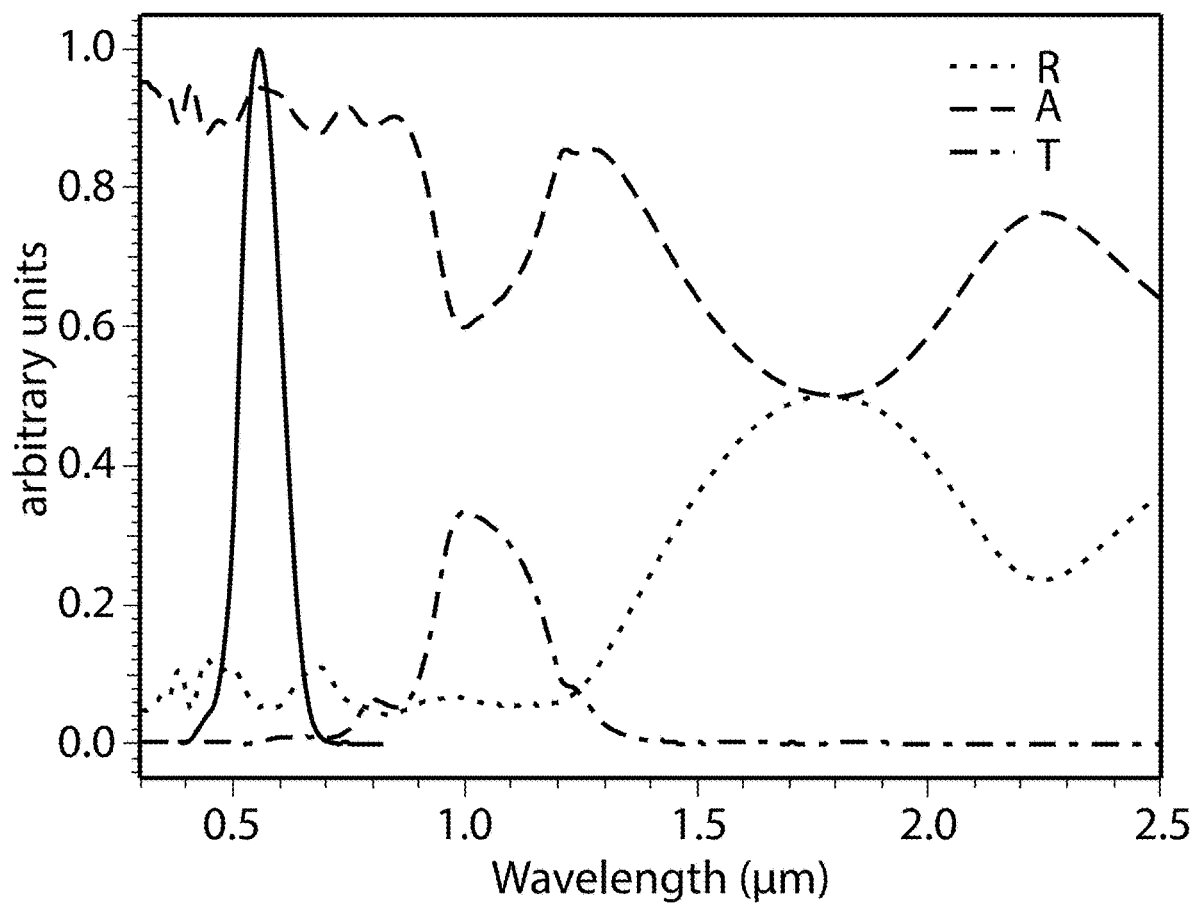
FIG. 6 illustrates the reflection (R), the absorption (A), and transmission (T) of an exemplary switchable window in the opaque state, according to some embodiments of the present disclosure.
Figure 7:
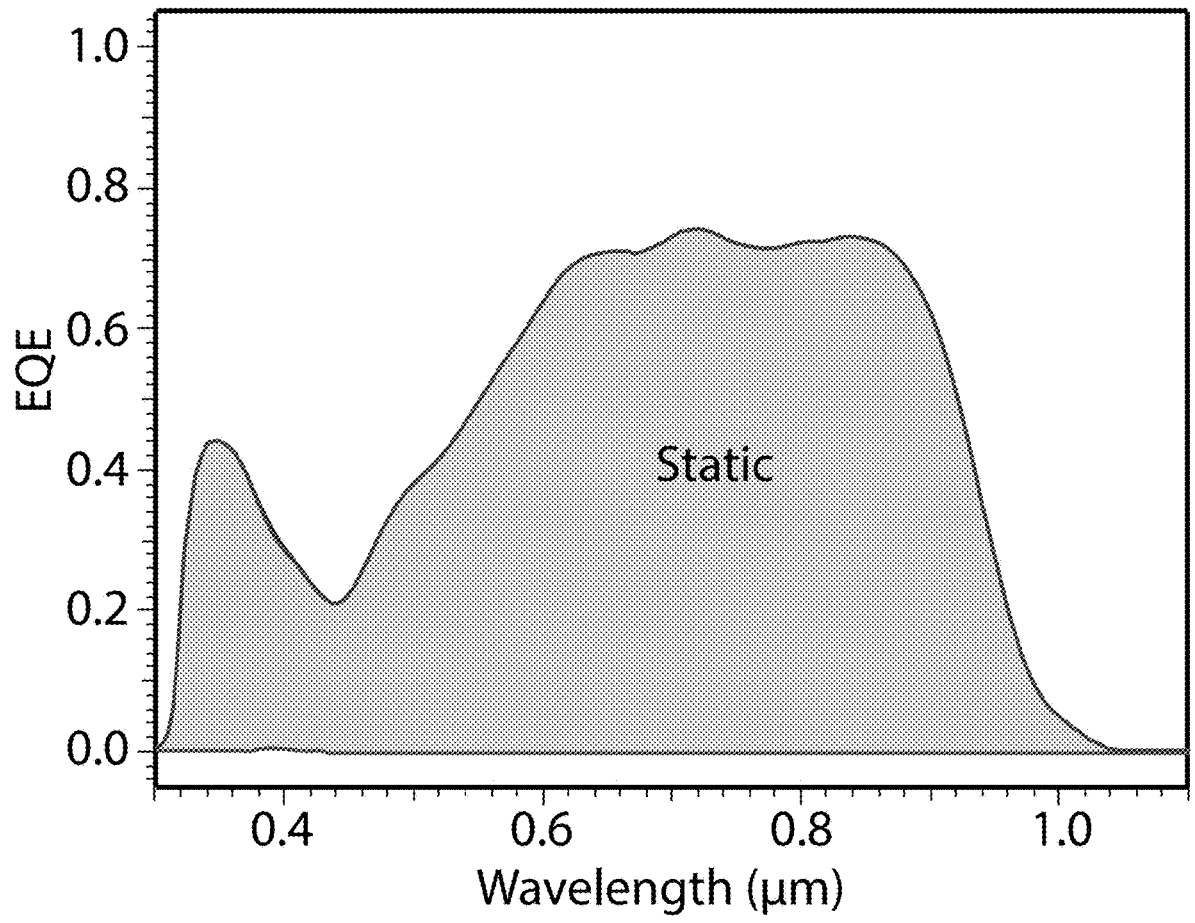
FIG. 7 illustrates the external quantum efficiency (EQE) of an exemplary switchable window in the transparent state, according to some embodiments of the present disclosure.
Figure 8:
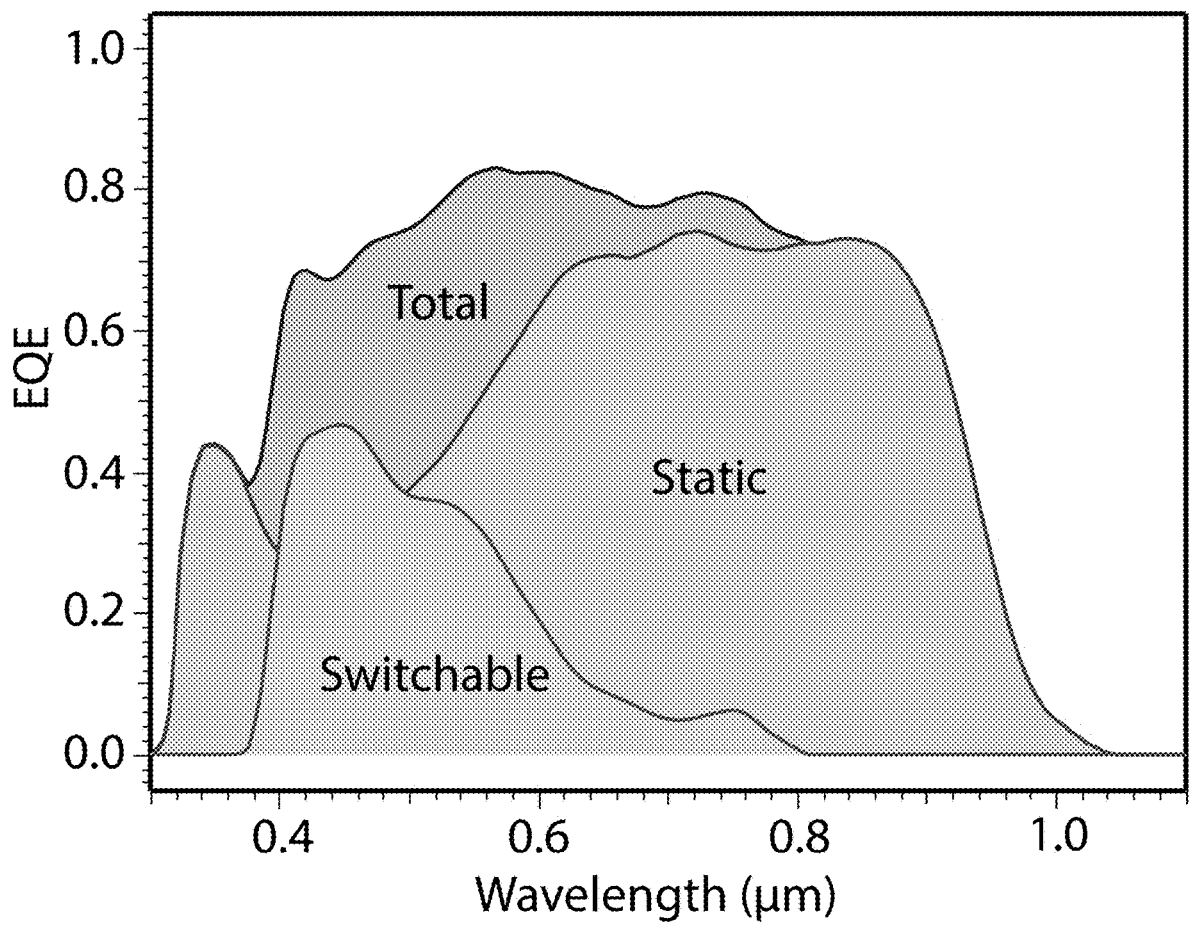
FIG. 8 illustrates the EQE of an exemplary switchable window in the opaque state, according to some embodiments of the present disclosure.

FIG. 5 illustrates the reflection (R), the absorption (A), and transmission (T) of the exemplary switchable window in the transparent state. The solid black line illustrates the photopic eye response to the visible transmittance through the device. FIG. 6 illustrates the reflection (R), the absorption (A), and transmission (T) of the exemplary switchable window in the opaque state. Solid black line illustrates the photopic eye response to the visible transmittance through the device. FIG. 7 illustrates the external quantum efficiency (EQE)) of the exemplary switchable window in the transparent state. FIG. 8 illustrates the external quantum efficiency (EQE)) of the exemplary switchable window in the opaque state.

EXAMPLES

Example 1. A device comprising: a switchable photovoltaic (PV) device comprising a first active material; and a static PV device comprising a second active material, wherein: the switchable PV device and the static PV device are positioned substantially parallel to one another, the switchable PV device has a first state that is substantially transparent to a first wavelength of light in the visible spectrum, the switchable PV device has a second state this is substantially opaque to a second wavelength of light in the visible spectrum, the switchable PV device can be reversibly switched between the first state and the second state, the static PV device is substantially transparent to the visible spectrum of light, and both the switchable PV device and static PV device are capable of generating power.

Example 2. The device of Example 1, wherein the static PV device absorbs a wavelength of light in at least one of the infrared (IR) region of light or in the ultraviolet (UV) region of light.

Example 3. The device of either Example 1 or 2, wherein the first active material comprises a perovskite.

Example 4. The device of any one of Examples 1-3, wherein the perovskite comprises a metal halide perovskite.

Example 5. The device any one of Examples 1-4, wherein the perovskite comprises at least one of a one-dimensional network, a two-dimensional network, or a three-dimensional network.

Example 6. The device of any one of Examples 1-5, wherein: the perovskite is described by a formula comprising at least one of $ABX_3$, $A_2BX_6$, or $A_3B_2X_9$, A comprises a first cation, B comprises a second cation, and X comprises an anion.

Example 7. The device of any one of Examples 1-6, wherein the first cation comprises at least one of an alkylammonium, formamidinium, or cesium.

Example 8. The device of any one of Examples 1-7, wherein the alkylammonium comprises at least one of methylammonium, ethylammonium, propylammonium, or dimethylammonium.

Example 9. The device of any one of Examples 1-8, wherein the second cation comprises at least one of lead, tin, or germanium.

Example 10. The device of any one of Examples 1-9, wherein the anion comprises a halide.

Example 11. The device of any one of Examples 1-10, wherein the halide comprises at least one chloride, iodide, or bromide.

Example 12. The device of any one of Examples 1-11, wherein the perovskite comprises an alkylammonium lead halide.

Example 13. The device of any one of Examples 1-12, wherein the perovskite comprises methylammonium lead iodide.

Example 14. The device of any one of Examples 1-13, wherein the second active material comprises at least one of an inorganic semiconductor or an organic semiconductor.

Example 15. The device of any one of Examples 1-14, wherein the inorganic semiconductor comprises at least one of silicon, germanium, gallium, arsenic, cadmium, tellurium, lead, or sulfur.

Example 16. The device of any one of Examples 1-15, wherein the organic semiconductor comprises at least one of polyacetylene, phthalocyanine, polyethylene terephthalate, poly(3,4-ethylenedioxythiophene), poly(3-methyl-thiophene), poly(3-hexylthiophene), a fullerene, or a fullerene derivative.

Example 17. The device of any one of Examples 1-16, wherein the organic semiconductor comprises at least one of poly[2,6'-4,8-di(5-ethylhexylthienyl)benzo[1,2-b;3,3-b[dithiophene]-alt-[3-fluoro-2[(2-ethylhexyl)carbonyl]thieno[3, 4-b[thiophenediyl], [6,6]-phenyl-C71-butyric acid methyl ester, or 2,2'-((2Z,2'Z)-(((4,4,9,9-tetrakis(4-hexylphenyl)-4, 9-dihydro-sindaceno[1,2-b:5,6-b']dithiophene-2,7-diyl)bis (4-((2-ethylhexyl)oxy)thiophene-5,2-diyl))bis(methanylylidene))bis(5,6-difluoro-3-oxo-2,3-dihydro-1H-indene-2, 1-diylidene))dimalononitrile.

Example 18. The device of any one of Examples 1-17, wherein the organic semiconductor comprises a carbonaceous material.

Example 19. The device of any one of Examples 1-18, wherein the first wavelength of light is between 380 nm and 750 nm, inclusively.

Example 20. The device of any one of Examples 1-19, wherein the first wavelength of light is 495 nm and 590 nm, inclusively.

Example 21. The device of any one of Examples 1-20, wherein the second wavelength of light is between 380 nm and 750 nm, inclusively.

Example 22. The device of any one of Examples 1-21, wherein the second wavelength of light is between 495 nm and 590 nm, inclusively.

Example 23. The device of any one of Examples 1-22, wherein: the switchable PV device further comprises, in order: a first charge collecting layer; a first charge transport layer; the first active material; a second charge transport layer; and a second charge collecting layer.

Example 24. The device of any one of Examples 1-23, wherein the first charge collecting layer comprises a fluorine-dope tin oxide.

Example 25. The device of any one of Examples 1-24, wherein the first charge collecting layer has a thickness between about 100 nm and 300 nm.

Example 26. The device of any one of Examples 1-25, wherein the first charge transport layer comprises at least one of tin oxide or titanium oxide.

Example 27. The device of any one of Examples 1-26, wherein the first charge transport layer has a thickness between 40 nm and 60 nm.

Example 28. The device of any one of Examples 1-27, wherein the second charge transport layer comprises nickel oxide.

Example 29. The device of any one of Examples 1-28, wherein the second charge transport layer has a thickness between 40 nm and 60 nm.

Example 30. The device of any one of Examples 1-29, wherein the second charge collecting layer comprises indium tin oxide.

Example 31. The device of any one of Examples 1-30, wherein the second charge collecting layer has a thickness a thickness between 40 nm and 60 nm.

Example 32. The device of any one of Examples 1-31, wherein the first active material is in the form of a layer having a thickness between 10 nm and 1000 nm.

Example 33. The device of any one of Examples 1-32, wherein: the static PV device further comprises, in order: a third charge collecting layer; a third charge transport layer;

the second active material; a fourth charge transport layer; and a fourth charge collecting layer.

Example 34. The device of any one of Examples 1-33, wherein the third charge collecting layer comprises a fluorine-dope tin oxide.

Example 35. The device of any one of Examples 1-34, wherein the third charge collecting layer has a thickness between about 100 nm and 300 nm.

Example 36. The device of any one of Examples 1-35, wherein the third charge transport layer comprises at least one of tin oxide or titanium oxide.

Example 37. The device of any one of Examples 1-36, wherein the third charge transport layer has a thickness between 40 nm and 60 nm.

Example 38. The device of any one of Examples 1-37, wherein the fourth charge transport layer comprises nickel oxide.

Example 39. The device of any one of Examples 1-38, wherein the fourth charge transport layer has a thickness between 40 nm and 60 nm.

Example 40. The device of any one of Examples 1-39, wherein the fourth charge collecting layer comprises indium tin oxide.

Example 41. The device of any one of Examples 1-40, wherein the fourth charge collecting layer has a thickness a thickness between 40 nm and 60 nm.

Example 42. The device of any one of Examples 1-41, wherein the second active material is in the form of a layer having a thickness between 10 nm and 1000 nm.

Example 43. The device of any one of Examples 1-42, wherein the switchable PV device and the static PV device are positioned within a frame.

Example 44. The device of any one of Examples 1-43, wherein: the switchable PV device and the static PV device each have a planar form, and the switchable PV device and the static PV device are positioned substantially parallel to one another.

Example 45. The device of any one of Examples 1-44, wherein the switchable PV device and the static PV device are in physical contact with each other.

Example 46. The device of any one of Examples 1-45, wherein a gap is positioned between the switchable PV device and the static PV device.

Example 47. The device of any one of Examples 1-46, wherein the gap is between 10 µm and 50 mm.

Example 48. The device of any one of Examples 1-47, wherein the gap is at a pressure less than atmospheric pressure.

Example 49. The device of any one of Examples 1-48, wherein the pressure is between $10^{-10}$ Torr and 620 Torr.

Example 50. The device of any one of Examples 1-49, wherein the gap contains a gas comprising at least one of nitrogen, helium, argon, or xenon.

Example 51. The device of any one of Examples 1-50, wherein the gap is at a pressure greater than atmospheric pressure.

Example 52. The device of any one of Examples 1-51, wherein the pressure is between 620 Torr and 1200 Torr.

Example 53. The device of any one of Examples 1-52, further comprising: a first layer; and a second layer, wherein: each of the first layer and the second layer are positioned substantially parallel to the switchable PV device, the switchable PV device and the static PV device are both positioned between the first layer structure and the second layer, both the first layer and the second layer are substantially transparent to light in the visible spectrum, and at least one of the first layer or the second layer is substantially transparent to at least one of IR light or UV light.

Example 54. The device of any one of Examples 1-53, wherein at least one of the first layer or the second layer is constructed of at least one of a glass, a plexiglass, or a transparent plastic.

Example 55. The device of any one of Examples 1-54, further comprising: a support structure, wherein: the support structure is in physical contact with at least one of the switchable PV device, the static PV device, the first layer, the second layer, or the frame, and the support structure is substantially transparent to visible light.

Example 56. The device of any one of Examples 1-55, wherein the support structure is substantially transparent to at least one of IR light or UV light.

Example 57. The device of any one of Examples 1-56, wherein the support structure comprises a layer constructed of at least one of a glass, a plexiglass, or a transparent plastic.

Example 58. The device of any one of Examples 1-57, further comprising: at least one of a glue or a sealant, wherein: the glue or the sealant bonds at least a first feature comprising the switchable PV device, the static PV device, the first layer, the second layer, the support structure, or the frame to a second feature comprising the switchable PV device, the static PV device, the first layer, the second layer, the support structure, or the frame, the first feature is different than the second feature, and the glue or the sealant is transparent to visible light.

Example 59. The device of any one of Examples 1-58, wherein the glue or the sealant is transparent to at least one of IR light or UV light.

Example 60. The device of any one of Examples 1-59, wherein the glue or the sealant comprises at least one of ethylene vinyl acetate (EVA), polyvinyl butyral (PVB), polyethylene, ethylene vinyl alcohol, or a polyolefin.

Example 61. The device of any one of Examples 1-60, wherein: the switchable PV device comprises a plurality of switchable PV devices, the static PV device comprises a plurality of static PV devices, the plurality of switchable PV devices and the plurality of static PV devices are integrated into a single planar structure, and each switchable PV device and each static PV device is positioned in the planar structure to receive light unobstructed by the other switchable PV devices and other static PV devices.

Example 62. The device of any one of Examples 1-61, wherein each switchable PV device has a length dimension between 2 nm and 5 microns.

Example 63. The device of any one of Examples 1-62, wherein each static PV device has a length dimension between 2 nm and 5 microns.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A switchable window comprising:
a switchable photovoltaic (PV) device comprising a perovskite and a first side configured to transmit light; and
a static PV device comprising an active material and a second side configured to transmit light, wherein:
the switchable PV device and the static PV device each have a planar form positioned parallel to a yz-reference plane,
the first side is positioned in a first plane parallel to the yz-reference plane,
the second side is positioned in a second plane parallel to the yz-reference plane,
the first side and the second side are separated by a first gap in an x-axis direction,
the switchable PV device has a first state that is substantially transparent to a first wavelength of light in the visible spectrum,
the switchable PV device has a second state this is substantially opaque to a second wavelength of light in the visible spectrum,
the switchable PV device can be reversibly switched between the first state and the second state, and
the static PV device is substantially transparent to the visible spectrum of light.

2. The switchable window of claim 1, wherein the static PV device absorbs a wavelength of light in at least one of the infrared (IR) region of light or in the ultraviolet (UV) region of light.

3. The switchable window of claim 1, wherein the perovskite comprises a metal halide perovskite.

4. The switchable window of claim 1, wherein the perovskite comprises an alkylammonium lead halide.

5. The switchable window of claim 4, wherein the perovskite comprises methylammonium lead iodide.

6. The switchable window of claim 1, wherein the active material comprises at least one of an inorganic semiconductor or an organic semiconductor.

7. The switchable window of claim 6, wherein the organic semiconductor comprises at least one of poly[2,6'-4,8-di(5-ethylhexylthienyl) benzo[1,2-b;3,3-b[dithiophene]-alt-[3-fluoro-2[(2-ethylhexyl)carbonyl]thieno[3,4-b [thiophenediyl], [6,6]-phenyl -C71-butyric acid methyl ester, or 2,2'-((2Z,2'Z)-(((4,4,9,9-tetrakis (4-hexylphenyl)-4,9-dihydro-sindaceno[1,2-b:5,6-b']dithiophene-2,7-diyl)bis(4-((2-ethylhexyl)oxy)thiophene-5,2-diyl)) bis(methanylylidene))bis(5,6-difluoro-3-oxo-2,3-dihydro-1H-indene-2,1-diylidene))dimalononitrile.

8. The switchable window of claim 1, wherein the first wavelength of light is between 380 nm and 750 nm, inclusively.

9. The switchable window of claim 1, wherein the second wavelength of light is between 380 nm and 750 nm, inclusively.

10. The switchable window of claim 1, wherein:
the switchable PV device further comprises, in order:
a first charge collecting layer;
a first charge transport layer;
a layer of the perovskite;
a second charge transport layer; and
a second charge collecting layer.

11. The switchable window of claim 10, wherein:
the static PV device further comprises, in order:
a third charge collecting layer;
a third charge transport layer;
a layer of the active material;
a fourth charge transport layer; and
a fourth charge collecting layer.

12. The switchable window of claim 1, further comprising:
a first layer and a second layer, wherein:
the second layer is positioned substantially parallel to the first layer,
the second layer and the static PV device form a second gap between the second layer and the second side,
the switchable PV device and the static PV device are positioned between the first layer and the second layer,
both the first layer and the second layer are substantially transparent to light in the visible spectrum, and
at least one of the first layer or the second layer is substantially transparent to at least one of IR light or UV light.

13. The switchable window of claim 12, further comprising:
a support structure, wherein:
the support structure is in physical contact with at least one of the switchable PV device, the static PV device, the first layer, or the second layer, and
the support structure is substantially transparent to visible light.

14. The switchable window of claim 1, wherein the switchable PV device and the static PV device are positioned within a frame.

15. The switchable window of claim 1, wherein the first gap is between 10 μm and 50 mm.

16. The switchable window of claim 1, wherein the first gap is at a pressure less than atmospheric pressure.

17. The switchable window of claim 1, wherein the first gap contains a gas comprising at least one of nitrogen, helium, argon, or xenon.

18. The switchable window of claim 14, further comprising:
a support structure, wherein:
the support structure is in physical contact with at least one of the switchable PV device, the static PV device, or the frame, and
the support structure is substantially transparent to visible light.

19. The switchable window of claim 18, wherein the support structure is substantially transparent to at least one of IR light or UV light.

* * * * *